(12) United States Patent
Dennison

(10) Patent No.: US 8,067,761 B2
(45) Date of Patent: Nov. 29, 2011

(54) SELF-ALIGNED MEMORY CELLS AND METHOD FOR FORMING

(75) Inventor: Charles H. Dennison, San Jose, CA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 12/908,406

(22) Filed: Oct. 20, 2010

(65) Prior Publication Data

US 2011/0031460 A1 Feb. 10, 2011

Related U.S. Application Data

(62) Division of application No. 12/075,913, filed on Mar. 14, 2008, now Pat. No. 7,838,341.

(51) Int. Cl.
*H01L 29/04* (2006.01)
(52) U.S. Cl. ............. 257/3; 257/4; 257/5; 257/E31.029; 365/148; 438/131
(58) Field of Classification Search ........................ None
See application file for complete search history.

(56) References Cited

U.S. PATENT DOCUMENTS

2007/0272913 A1* 11/2007 Scheuerlein ...................... 257/4
2008/0237566 A1* 10/2008 An et al. ........................... 257/4

* cited by examiner

*Primary Examiner* — Evan Pert
*Assistant Examiner* — Scott R Wilson
(74) *Attorney, Agent, or Firm* — Kevin L. Bray

(57) ABSTRACT

The invention provides a memory cell based on variable resistance material memory element that includes an access device having a pillar structure that may also include a protective sidewall layer. The pillar access device selects and isolates the memory cell from other memory array cells and is adapted to both self-align any memory element formed thereon, and to deliver suitable programming current to the memory element. The pillar structure is formed from one or more access device layers stacked above a wordline and below the memory element. Optional resistive layers may be selectively formed within the pillar structure to minimize resistance in the access device layer and the memory element. The pillar access device may be a diode, transistor, Ovonic threshold switch or other device capable of regulating current flow to an overlying programmable memory material.

28 Claims, 23 Drawing Sheets

SELF-ALIGNED MEMORY CELLS AND METHOD FOR FORMING

RELATED APPLICATION INFORMATION

This application is a division of and claims priority from U.S. patent application Ser. No. 12/075,913, filed Mar. 14, 2008, now U.S Pat. No. 7,838,341, the disclosure of which is hereby incorporated by reference herein.

FIELD OF INVENTION

The invention relates generally to the use of variable resistance memory materials in semiconductor devices. More particularly, the invention relates to the formation of an access device that may be used in conjunction with a variable resistance memory element to form a self-aligned memory cell for use in an electronic memory array.

BACKGROUND OF THE INVENTION

The use of programmable variable resistance materials in electronic devices is known in the art. The chalcogenides are an important class of programmable variable resistance materials. The principles of operation of chalcogenide (and phase change) materials and devices are described in U.S. Pat. Nos. 5,296,716, 5,341,328, 5,359,205, and 7,227,170, all to Ovshinsky et al., which are incorporated herein by reference. These patents are believed to evidence the state of the prior art and to represent current theory of operation and function of phase change materials and chalcogenide-based memories known to those skilled in the art.

Briefly, variable resistance materials are materials that can be caused to change physical or electronic state, and therefore resistivity level, in response to an electrical input stimulus. By way of example, phase-change materials (many chalcogenide) may be electrically stimulated to transform among structural states ranging from a predominantly crystalline state to a predominantly amorphous state. By controlling the amount of electrical energy applied to a chalcogenide phase-change material, the relative proportions of crystalline and amorphous phase content can be continuously varied from a low crystalline phase volume fraction to a high crystalline phase volume fraction. The resistivity of a chalcogenide phase-change material correlates with the crystalline phase volume fraction and progressively decreases as the crystalline phase volume fraction increases. A chalcogenide phase-change material may be predictably placed in a particular resistivity state by running a current of a certain amperage for a certain duration through it. The resistivity state so fixed will remain unchanged unless and until a current having a different amperage or duration within the programming range is run through the material.

Because of these unique characteristics, variable resistance memory materials may be used in memory cells for storing data in binary or higher-based digital systems. Such memory cells will normally include a memory element that is capable of assuming multiple, generally stable, states in response to the application of a stimulus. In most cases, the stimulus will be a voltage differential applied across the element so as to cause a predetermined current to flow through the memory element. A chalcogenide-based memory cell will typically include a chalcogenide memory element utilizing a chalcogenide phase-change material for storing data and an access element, coupled to the memory element, for use in programming and sensing the stored data. The access element may be, in one embodiment, a diode.

To achieve high density storage of data, memory arrays comprising a multitude of chalcogenide memory elements may be fabricated. In a memory array, a grid of conductive row lines (wordlines) and column lines (digit lines or bit lines) is formed in which a series combination of an access element and a chalcogenide memory cell is located at each junction of a row line and column line. The row lines and columns lines are connected to external circuitry (such as drivers or sense amplifiers) and individual memory cells are programmed or read by selective application of voltages to the row line and column line between which the memory cell is interconnected. Selection of the row line and column line of a particular memory cell produces a voltage differential that activates the access element, thus enabling current to pass through the memory element. Access elements at non-selected junctions of the array prevent stray current from altering the state of memory elements located at non-selected junctions.

Because of the unique operating characteristics of memories based on variable resistance memory elements, control of current flow is crucial to facilitate programming. Programming of chalcogenide phase-change materials, for example, requires high current densities. In this regard, it is desirable that a chalcogenide-based memory cell include a diode or other access element capable of permitting a large current flow in the forward direction to program the memory cell. Conventional junction diode structures that are capable of supplying the necessary current require a significant number of complex processing steps to create compared to a deposited thin film diode. Accordingly, there is a need for a stable and easily manufactured access device that can meet the performance requirements of chalcogenide-based memory cells, while permitting fabrication of small footprint devices with minimal added processing steps to achieve a cost effective high density memory arrays.

SUMMARY OF THE INVENTION

The invention provides a memory cell based on a variable resistance material memory element, and including an access device with a vertical, pillar structure. In one embodiment, the pillar structure is insulated with a sidewall spacer. The pillar structure access device selects and isolates each memory cell from other memory cells in a memory array and is adapted to both self-align any memory element formed thereon, and to deliver suitable programming current to the memory element.

The pillar structure is formed from one or more access device layers stacked above a wordline and below the memory element. Optional diffusive barrier layers may be selectively formed within the pillar structure to prevent migration or diffusion of elements between layers of the access device and the memory element. The access device is easily constructed using conventional techniques and includes a single masking step. In this way, a highly effective access device can be easily and efficiently created for delivering a suitable programming current to the memory element, while minimizing the size of the memory cell. In one embodiment, the pillar structure access device includes a sidewall layer.

Also disclosed is a method for forming a memory cell with a pillar structure access device. The method includes forming a patterned or subtractive row line with oxide fill, forming one or more access device layers, forming a disposable hard mask over the access device, forming a patterned photoresist over the disposable hard mask, etching the stack of layers to form a pillar structure, removing the photoresist, depositing an insulating fill, planarizing, selectively etching the disposable hard mask to form an opening, depositing an active material in the opening, and forming an upper electrode or column lines over the active material. Variations on the method include forming a sidewall layer adjacent to the pillar structure access device, reducing the volume of active material by depositing sidewall layers in the opening formed by removing the disposable hard mask, and/or recessing the active material to permit formation of an aligned upper electrode for interconnection to the column lines. The structure may also include a barrier layer between the row line and pillar structure access device and/or between the pillar structure access device and the active material.

For a better understanding of the instant invention, together with other and further illustrative objects thereof, reference is made to the following description, taken in conjunction with the accompanying drawings and claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 26 through 32 shows a process for making a memory cell in accordance with an embodiment of the invention;

DETAILED DESCRIPTION OF ILLUSTRATED EMBODIMENTS

In the following paragraphs and in association with the accompanying figures, examples of memory devices formed according to embodiments of the invention are disclosed. Specific embodiments of memory elements and methods of making such memory elements are described below as they might be implemented for use in semiconductor memory circuits. In the interest of clarity, not all features of an actual implementation are described in this specification. Additionally, like elements will be referred to with like numbers throughout description of several embodiments of the invention.

The invention relates to self-aligned phase change memory cells that include a memory element with a variable resistance memory material and an access device with a pillar structure and a protective sidewall layer.

The access device is used as an isolation/select device between rows and columns and the access device is formed by depositing and etching an 'access device pillar structure'. A method of the invention self-aligns the subsequently deposited programmable resistance elements. The current method would be to first form the access device pillar structure, deposit an insulating layer thereon, planarize the pillar structure and then deposit a programmable resistance material on top of the access device pillar structure thereby providing good alignment of the programmable resistance material with the access device pillar structure. The method of an embodiment of the invention reliably forms the pillar structure and operates to reduce programming current. Additionally, the invention eliminates the need for additional lithography and etching steps typically associated with forming memory cells. The pillar structure may be used to self-align any memory cell.

Figure 1:
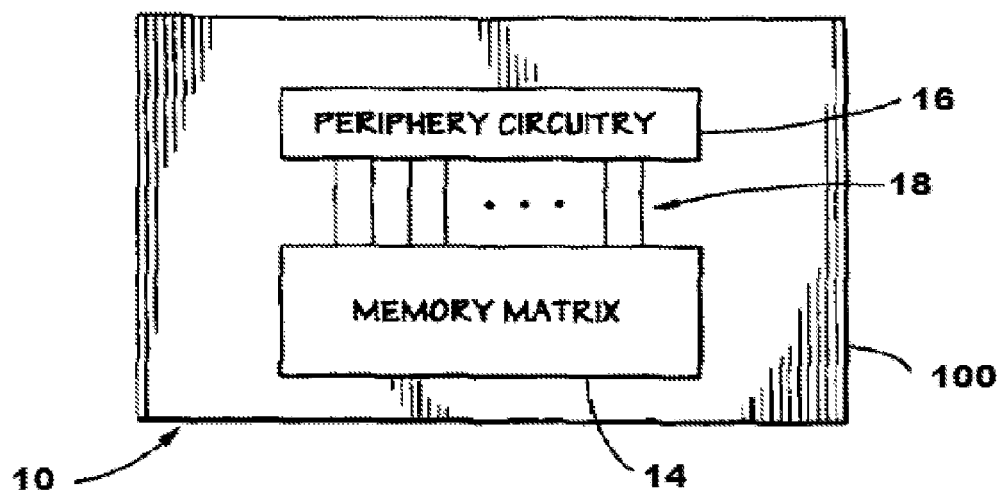
FIG. 1 shows a high-level diagram of a memory device in accordance with an embodiment of the invention including a memory array and periphery circuitry formed on a substrate.

Turning now to the drawings, and referring initially to FIG. 1, a memory device is illustrated and generally designated by a reference numeral 10. The memory device 10 is an integrated circuit memory formed on a semiconductor substrate 100. The memory device 10 includes a memory matrix or array 14 that includes a plurality of memory cells for storing data. The memory matrix 14 is coupled to periphery circuitry 16 by the plurality of control lines 18. The periphery circuitry 16 may include circuitry for addressing the memory cells contained within the memory array 14, along with circuitry for storing data in and retrieving data from the memory cells. The periphery circuitry 16 may also include other circuitry used for controlling or otherwise insuring the proper functioning of the memory device 10.

Figure 2:
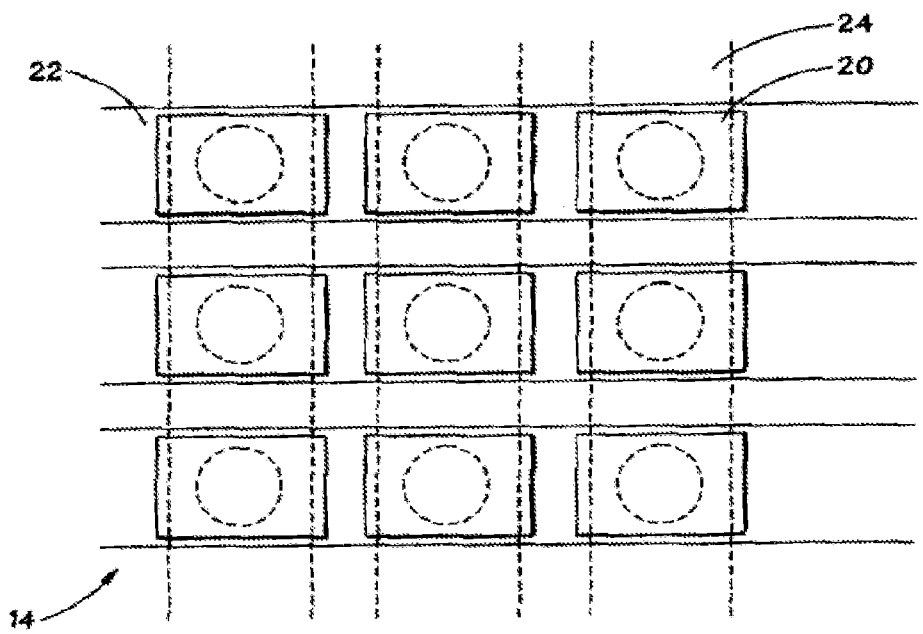
FIG. 2 shows a high-level diagram of a memory array in accordance with an embodiment of the invention.

A top view of the memory array 14 is shown in FIG. 2. As can be seen, the memory array includes a plurality of memory cells 20 that are arranged in generally perpendicular rows and columns. As can be seen, the memory array 14 includes a plurality of memory cells 20 that are arranged in generally perpendicular rows along an x-direction and columns along a y-direction. The memory cells 20 in each row are coupled together by a respective wordline 22, and the memory cells 20 in each column are coupled together by a respective bitline 24.

Figure 3:
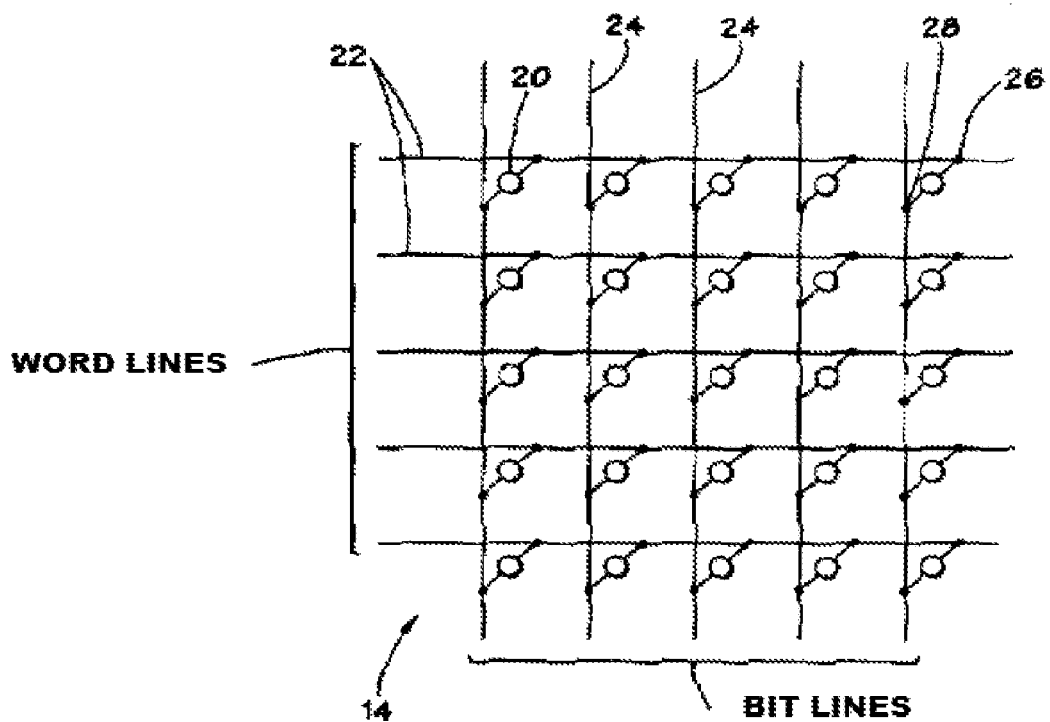
FIG. 3 is a schematic diagram of a memory array in accordance with an embodiment of the invention.

A schematic diagram of the memory array 14 is shown in FIG. 3. Memory array 14 comprises a plurality of horizontally disposed wordlines or rowlines 22 and vertically disposed bitlines or columns 24. As used herein, the terms wordline and rowline are used interchangeably. Each memory cell is disposed between a wordline and a bitline. As can be seen, each memory cell 20 includes a wordline node 26 that is coupled to a respective wordline 22, and each memory cell 20 includes a bitline node 28 that is coupled to a respective bitline 24. The conductive wordlines 22 and bitlines 24 are collectively referred to as address lines. These address lines are electrically coupled to the periphery circuitry 16 (shown in FIG. 1) so that each of the memory cells 20 can be accessed for the storage and retrieval of information.

Figure 4:
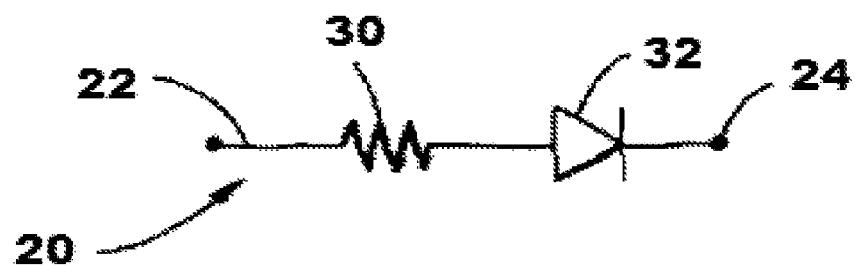
FIG. 4 is a schematic diagram of a memory cell incorporating a programmable resistance memory material.

FIG. 4 illustrates an exemplary memory cell 20 that may be used in the memory array 14. The memory cell 20 includes a programmable resistance element 30 which is coupled to an access device 32. The access device electrically isolates each memory element from all other memory elements in the array. The access device may also be referred to herein as an isolation device, selection device, or select device. In the embodiment of FIG. 4, the memory element 30 is illustrated as a programmable resistance element, and the access device 32 is illustrated as a diode. However, in other embodiments, a programmable resistance element having a variable threshold voltage or variable resistivity such as, but not limited to, phase change materials, pnictide materials, and resistive oxides may be used. The programmable resistance element may be made of a chalcogenide material, as will be more fully explained below.

Also, any access device capable of isolating and selecting a respective memory element within the memory array may be used. The memory elements of the invention may be electrically coupled to access devices and addressing lines in order to form a memory array. The access devices permit each discrete memory cell to be read and written to without interfering with information stored in adjacent or remote memory cells of the array. Generally, the invention is not limited to the use of any specific type of access device. Examples of access devices include field-effect transistors, bipolar junction transistors, ovonic threshold switching devices (OTS) and diodes. Examples of field-effect transistors include JFET and MOSFET. Examples of MOSFET include NMOS transistors and PMOS transistors. Furthermore NMOS and PMOS may even be formed on the same chip for CMOS technologies. Hence, associated with each memory element of a memory array structure is an access device that enables the memory element to be read and written without interfering with information stored in other adjacent or remote memory elements of the array.

As illustrated in FIG. 4, the memory element 30 is coupled to a wordline 22, and the access device 32 is coupled to a bitline 24. However, it should be understood that connections of the memory element 20 may be reversed without adversely affecting the operation of the memory array 14.

Figure 24:
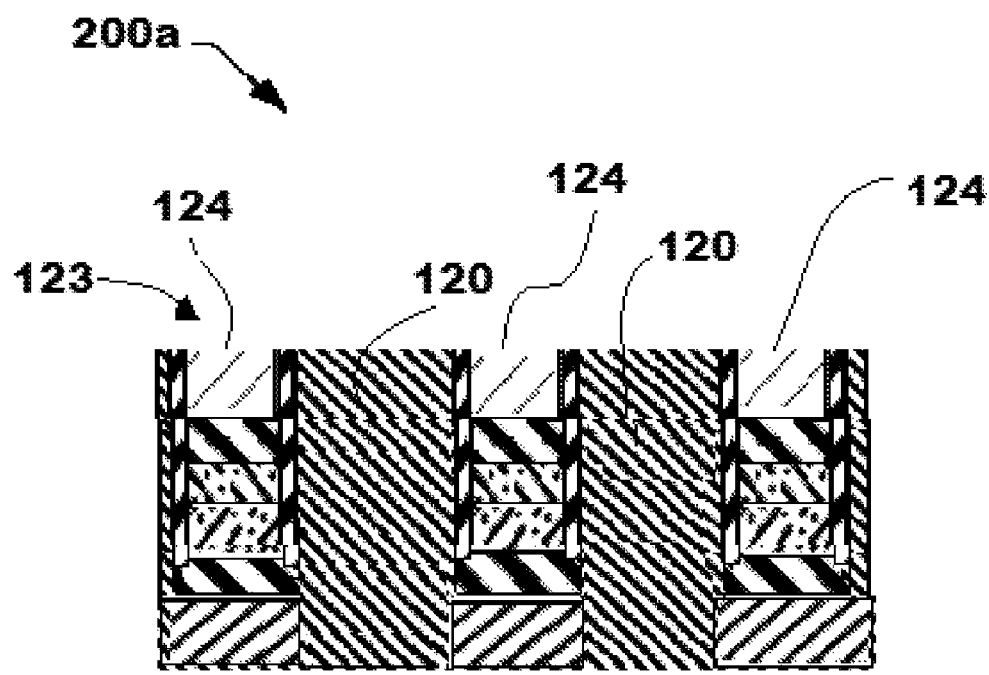
Figure 25:
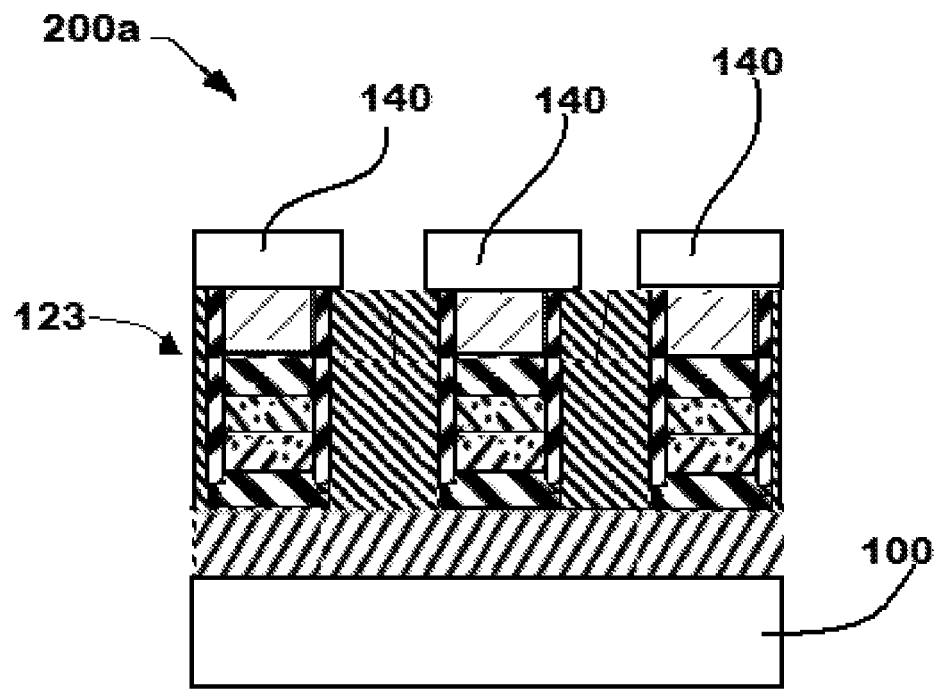
Figure 26:
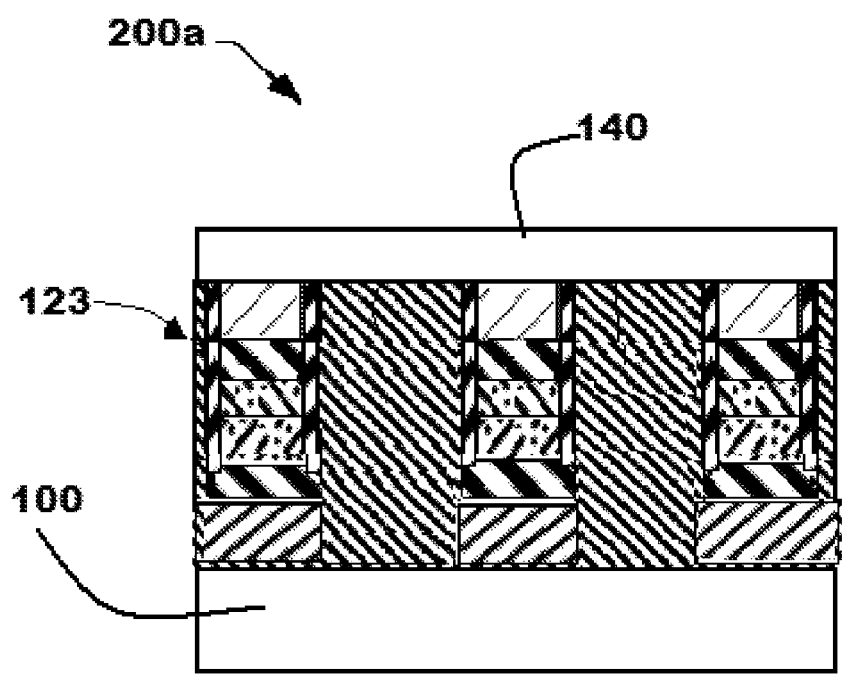

The actual structure of exemplary memory cells 200a-f are illustrated in FIGS. 25-26 (200a), 31-32 (200c), 35-36 (200d), and 39-40 (200e), respectively, while a method for fabricating each of the memory cells 200a-f is described with reference to FIGS. 5-42. It should be understood that while the fabrication of only single memory cells, 200a-f is discussed below, a plurality of similar memory cells may be fabricated simultaneously. Although not illustrated, each memory cell is electrically isolated from other memory cells in the array in any suitable manner, such as by the addition of embedded field oxide regions between each memory cell.

Wordlines run in a plane parallel (X-direction) to the cross-section of each memory cell shown in odd numbered FIGS. 7-41. Just as wordlines run in a plane parallel to the cross-section shown in memory cells illustrated in odd numbered FIGS. 7-41, bitlines as shown in even numbered FIGS. 8-42 run in the plane orthogonal (Y-direction) to each cross-section shown for the x-direction.

Figure 5:
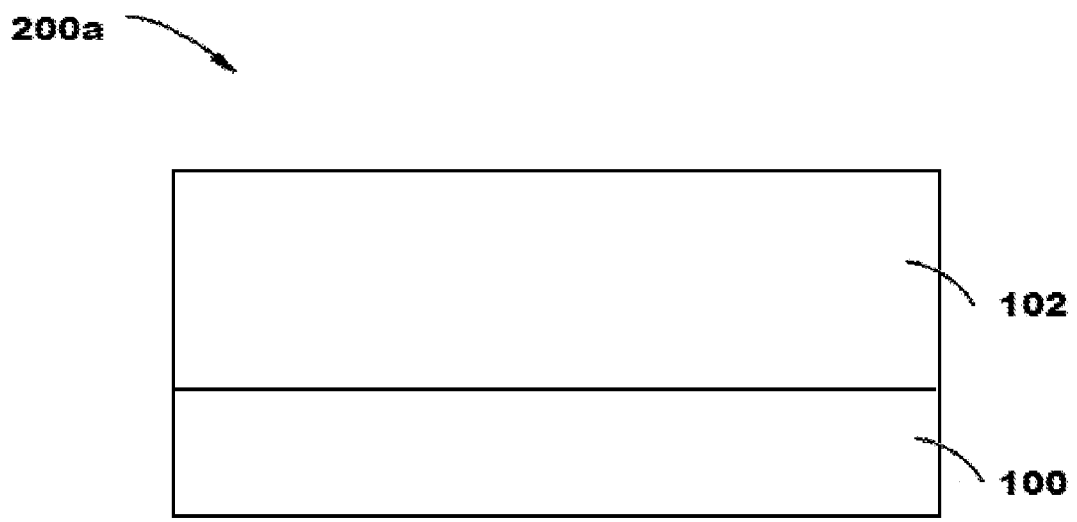
FIGS. 5 through 14 show a process for making a memory cell in accordance with an embodiment of the invention.
Figure 6:
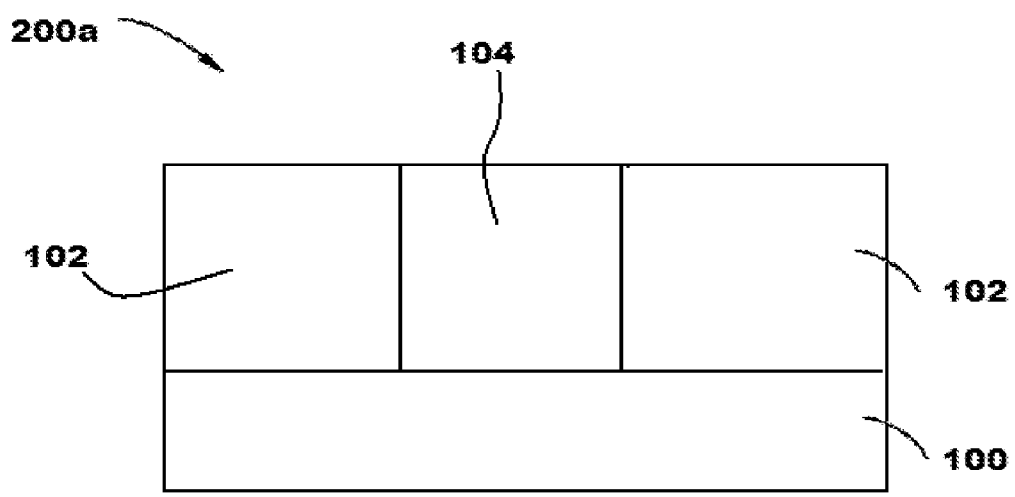

An access device and a programmable resistance device forming each memory cell 20 are physically and electrically disposed in series between bitline and wordline. Referring first to FIGS. 5-6, a semiconductor substrate 100 is provided. The substrate 100 may include wordlines or rowlines 102 formed thereon with a base oxide 104 deposited between each rowline 102 on the substrate 100. In an embodiment of the invention a contact may be formed above the rowline. While it is understood that each of the portions of memory cells 200a-f are shown in several embodiments of process flows in FIGS. 5-42, the substrate 100, while only shown in FIGS. 5-6, 25-26, 31-32, 35-36, and 39-40, respectively, is an integral part of each of the cells 200a-f. Each memory cell on the memory array is formed on substrate 100.

FIGS. 5-14, and 17-26 illustrate initial steps of a process flow of fabrication of a memory cell 200a that includes an access device 112 defined as a pillar diode select device 112 in an embodiment of the invention.

Odd numbered FIGS. 5-13, and 17-25 illustrate a cross-sectional view of the memory cell 200a taken across the device in the x-direction. Even numbered FIGS. 6-14, and 18-26 illustrate a cross-sectional view of the memory cell 200a taken across the memory cell 200a in the y-direction. FIGS. 5-14, and 17-24 illustrate the memory cell 200a at successive intermediate stages of development.

Initially, as illustrated in FIG. 5, a bottom rowline 102 formed from a conductive layer is defined and planarized on the substrate 100. As shown in FIG. 6, in an embodiment of the invention, rowline 102 is preferably formed from a material that has a resistivity which is less than the resistivity of a subsequent and adjacent insulating layer 104. In an embodiment of the invention, rowline 102 is a patterned rowline (e.g. a damascene structure with Cu or other metal) or a subtractive rowline (e.g. Al or other metal, heavily doped polysilicon, a silicide, or the like). Examples of the materials that may be used to form rowline 102 include, but are not limited to Cu, Al, other metal, polysilicon, silicon carbide, tungsten, titanium tungsten, tungsten silicide, other metal silicides, molybdenum, molybdenum nitride, and titanium nitride. In the case of polysilicon or silicon carbide, heavy n-type or p-type doping is recommended to provide sufficient conductivity.

After patterning, as shown in FIG. 6, a planar base oxide fill to provide insulating layer 104 may then be deposited on the substrate 100 to fill between each rowline 102 and then may be planarized by a suitable process such as chemical mechanical polishing (CMP).

In the embodiment shown in FIGS. 7-42, subsequent layers above the rowlines 102 and insulating layer 104 are raised above the substrate 100 and are remote to the substrate 100.

Figure 7:
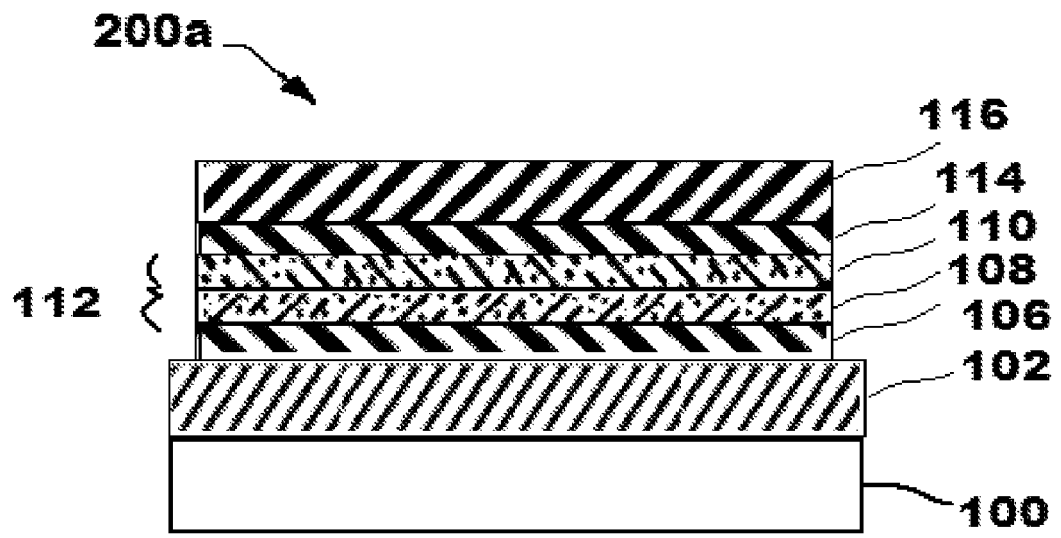
Figure 8:
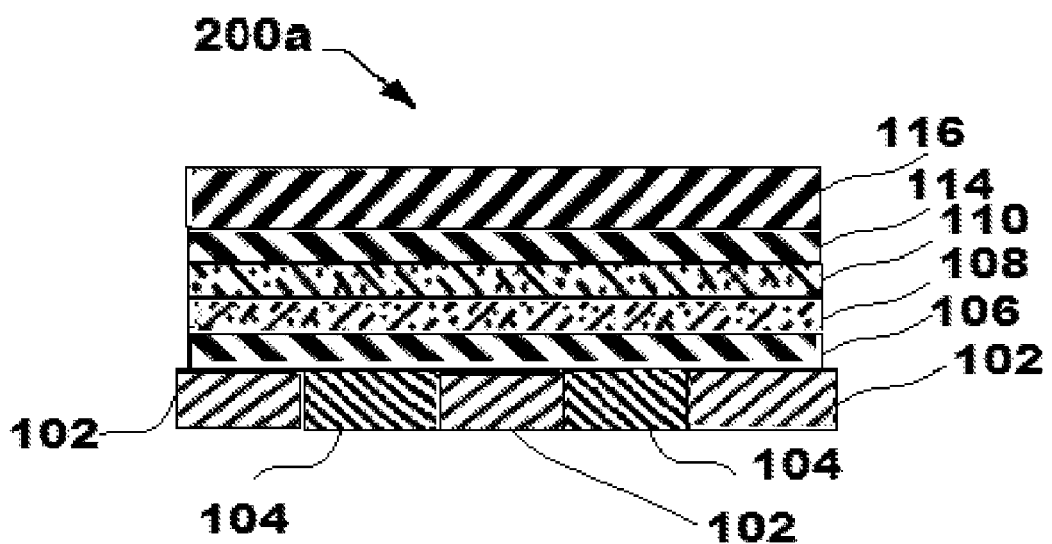

In an embodiment of the invention, an optional first barrier layer 106 shown in FIGS. 7-8, is deposited on the rowline 102 and insulating layer 104. First barrier layer 106 is sufficiently conductive to permit current flow from rowline 102 to layers (including access device layers and a variable resistance layer) formed above first barrier layer 106 (see below), but is generally less conductive than rowline 102. The primary function of first barrier layer 106 is to inhibit diffusion of the rowline material into layers formed above rowline 102. The extent of elemental diffusion between rowline 102 and upper layers of the structure depends in part on composition. Certain rowline materials, such as Cu (or other metal having a small atomic diameter), are facile diffusers and readily contaminate adjacent layers. The presence of first barrier layer 106 inhibits undesirable interdiffusion of elements between rowline 102 and upper layers in the structure used for an access device or for a variable resistance memory element.

Since diffusion is driven by concentration gradients, it can be minimized by selecting row line compositions that are similar to the compositions of the access device layers. A rowline comprised of heavily doped silicon or silicide, for example, will exhibit low interdiffusion with subsequently deposited silicon-based layers due to a low diffusional driving force. If interdiffusion is expected to be low, first barrier layer 106 is optional and may be excluded from the structure.

Since first barrier layer 106 is generally more resistive than rowline 102, it may also serve as a heater layer to transfer thermal energy into upper access device layers or the variable resistance memory layer. The Joule heating that occurs as current passes through first barrier layer 106 provides a source of energy that may be used to influence the programming of thermally sensitive variable resistance memory layers (e.g. phase-change layers).

The barrier layer 106 may include one or more elements selected from the group consisting of Ti, V, Cr, Zr, Nb, M, Hf, Ta, W, and mixtures or alloys thereof, and one or more elements selected from the group consisting of B, C, N, O, Al, Si, P, S, and mixtures or alloys thereof. Examples of materials include titanium nitride, titanium aluminum nitride, titanium carbonitride, titanium silicon nitride, tantalum nitride, and tantalum silicon nitride. Other examples of materials include amorphous carbon, amorphous silicon or a dual amorphous carbon/amorphous silicon structure.

In an embodiment of the invention, an access device 112 such as a diode shown in FIG. 4, a transistor, an OTS (shown in FIGS. 41-42) or a combination of access devices is deposited on the first barrier layer 106. The access device 112 operates to isolate and to control access to each memory cell in the memory array based on signals provided to the addressing lines.

In an embodiment of the invention shown in FIGS. 7-25, access device 112 is a diode. Operable diodes include PN diodes, NP diodes, PIN diodes, and NIP diodes. The diodes may be formed from vertically-stacked combinations of N-type, P-type, and/or I-type (intrinsic) silicon, polysilicon, germanium, or other semiconducting material.

In an embodiment of the invention, a first doped silicon or polysilicon layer 108 and a second doped silicon or polysilicon layer 110, wherein the first and second doped polysilicon layers 108, 110 include a P-type layer and an N-type layer, may be deposited over the optional first barrier layer 106 to form a PN or NP junction to serve as a diode access device 112.

In an embodiment of the invention, a third silicon or polysilicon layer (not shown) having intrinsic character may be formed between the first and the second doped silicon or polysilicon layers 108, 110 to form a PIN or a NIP diode access device.

The PN, NP, PIN, or NIP layers may form a diode access device 112 that may be formed by a single Si deposition process and associated ion implants and/or combination of deposited films and added dopants. It is understood that layers 108 and 110 may be interchanged without adversely affecting operation of the memory cell 200a.

Figure 41:
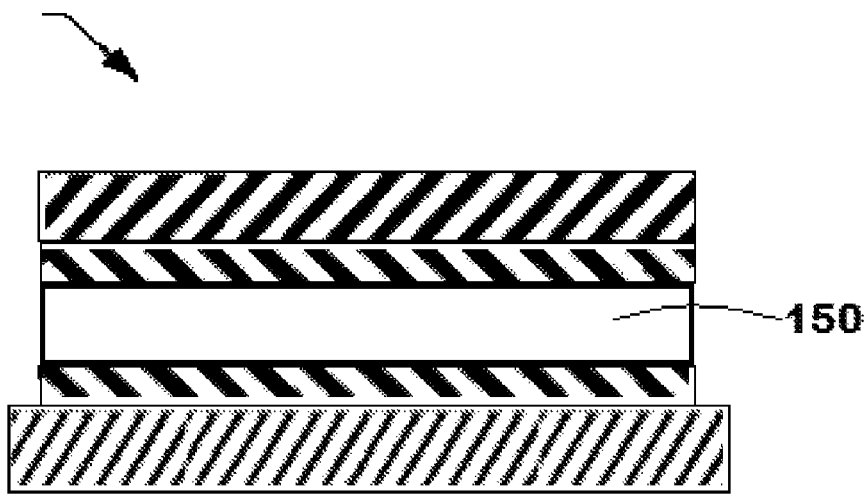
FIGS. 41 through 42 shows an embodiment of a portion of memory cell in accordance with an embodiment of the invention.
Figure 42:
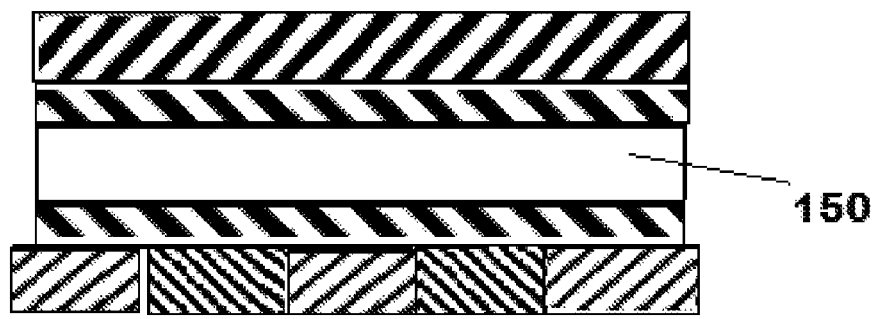

In an embodiment of the invention shown in FIGS. 41 and 42, a programmable resistance memory cell 200f having layers formed from the same process flow as used to form the memory cell 200a shown in FIGS. 5-14, and 17-26, is shown where, instead of a diode select device, the access device 212 is an ovonic threshold switching (OTS) device. The operational characteristics and representative ovonic threshold switching materials are discussed, for example, in U.S. Pat. Nos. 6,967,344; 6,969,867; and references therein; the disclosures of which are incorporated by reference herein.

In an embodiment of the invention shown in FIGS. 5-14, and 17-26, a second optional barrier layer 114 may be deposited on top of the select device layer or layers 112. The second barrier layer may be formed from any of the materials identified hereinabove to form the first barrier layer 106. The purpose of optional barrier layer 114 is to prevent or limit interdiffusion of atomic species between access device 112 and subsequently formed layers (e.g. variable resistance layer) in the device structure. As is the case with first barrier layer 106, second barrier layer 114 may not needed when the driving force for diffusion into or from the layers of access device 112 is low, for example, due to the compositions of the layers used to form access device 112 relative to the composition of subsequently formed layers. Based on concentration gradients and/or relative elemental diffusivity, the tendency for interdiffusion may be low and second barrier layer 114 may be excluded.

In the embodiment of the invention shown in FIGS. 7 and 8, a disposable hard mask 116 is next deposited over optional second barrier layer 114. If second barrier layer 114 is omitted, then mask 116 may be directly deposited over the access device 112.

The disposable hard mask 116 may be formed from any material that may be patterned and selectively etched back relative to a surrounding oxide fill 120 (shown in FIGS. 17-26 as discussed further below) to form one or more access device pillar structures 123. In an embodiment of the invention, the hard mask 116 is formed from silicon nitride or silicon-rich silicon nitride.

Figure 9:
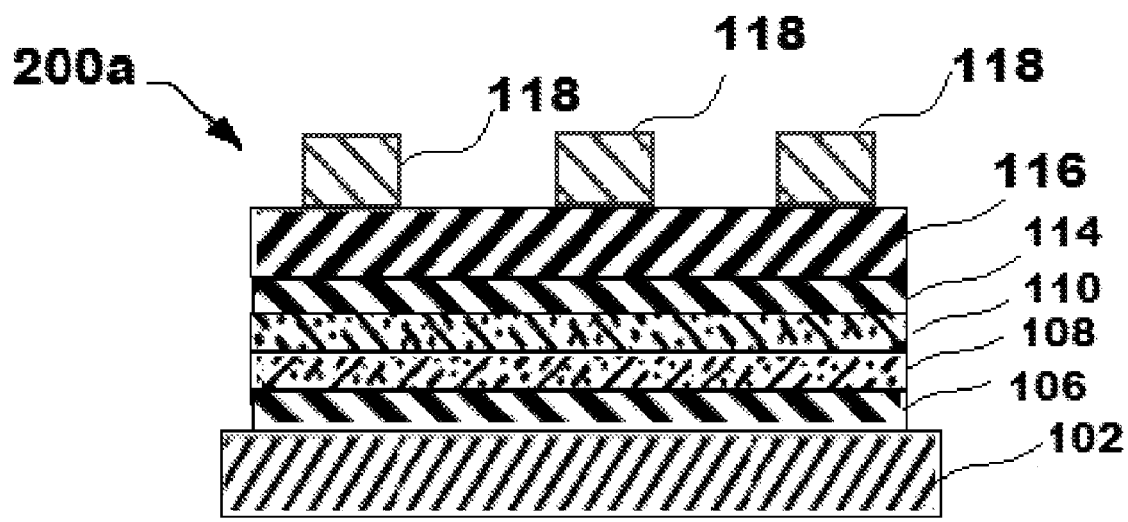
Figure 10:
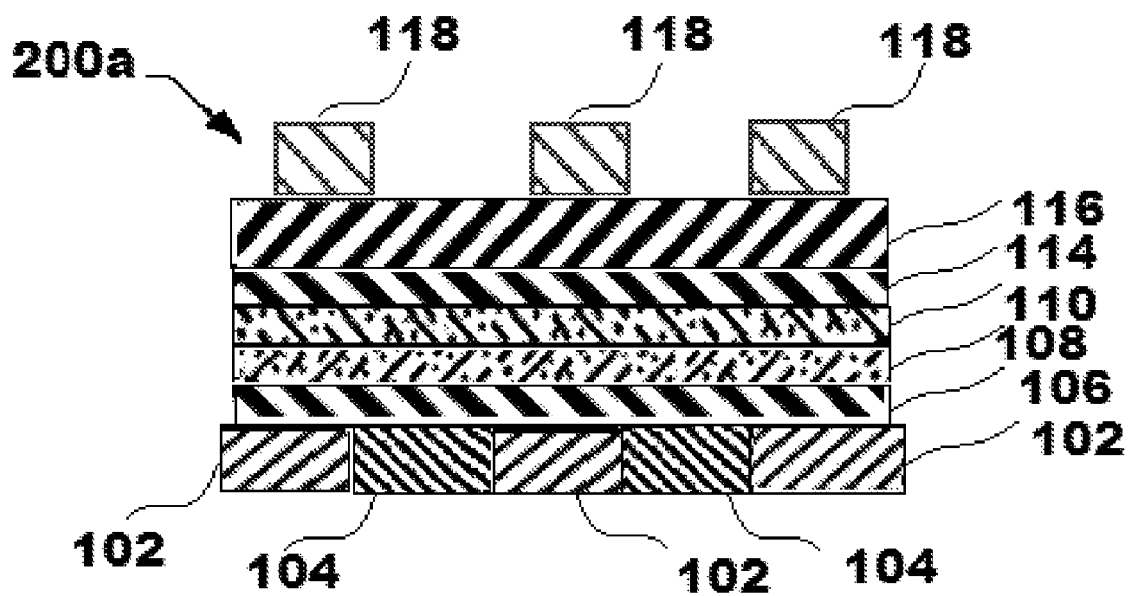

In the next step, a photoresist layer is formed over disposable hard mask 116 and patterned. Standard photolithographic techniques may be used to pattern the photoresist layer. The size and shape of the patterned photoresist regions will ultimately define the lateral cross-section of the pillar device structure described more completely hereinbelow. The patterned photoresist regions, and thus each pillar structure, may be sized at the photolithographic limit. FIGS. 9-10 illustrate the resulting memory cell 200a having a patterned photoresist layer 118 deposited on the disposable hard mask 116.

Figure 11A:
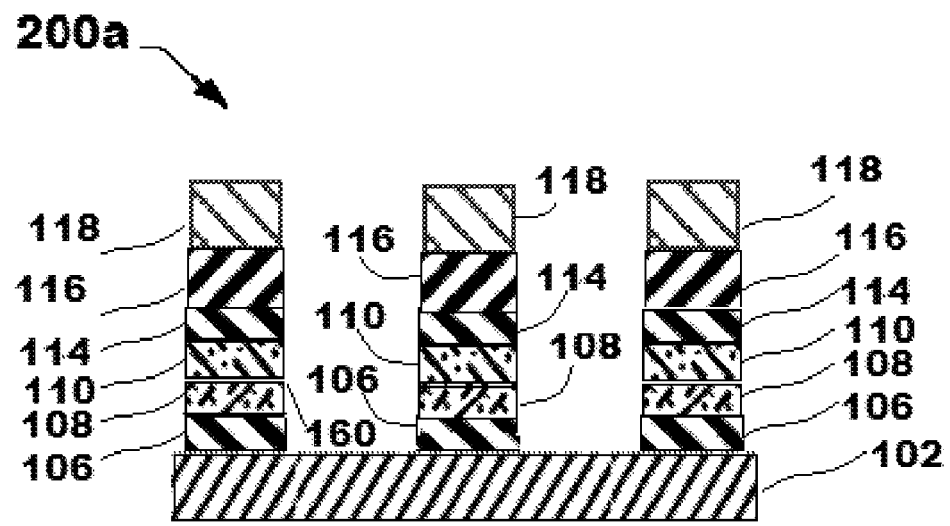
Figure 12A:
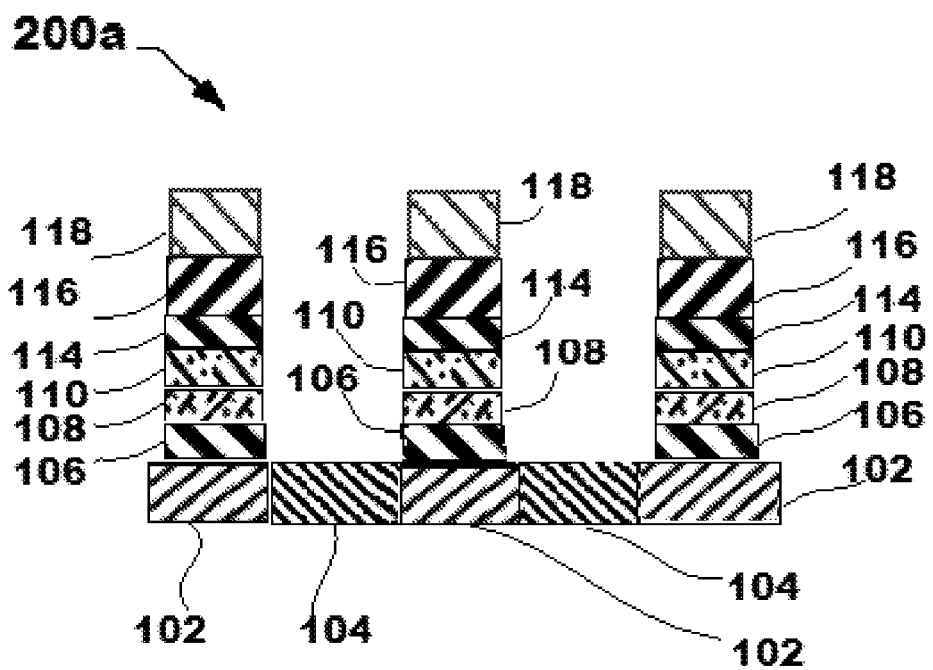
Figure 11B:
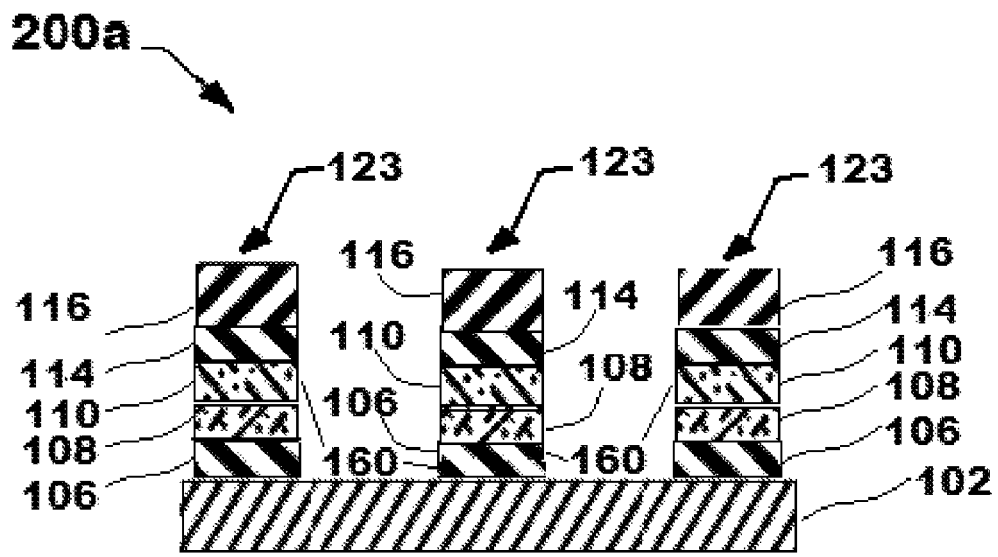
Figure 12B:
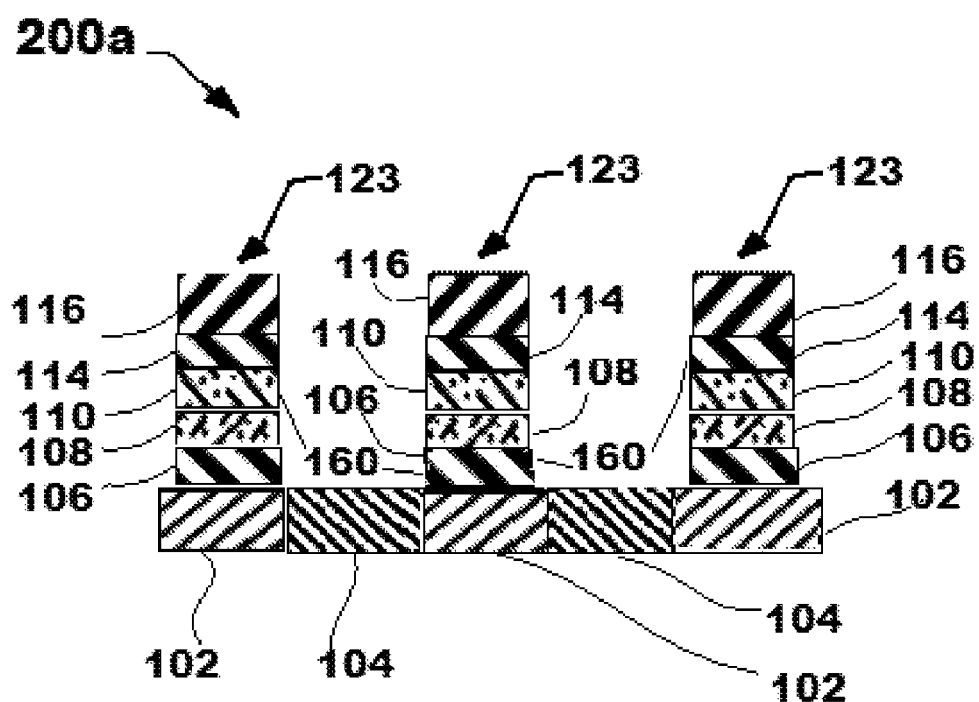

FIGS. 11a, 12a illustrate the memory cell 200a shown in FIGS. 9 and 10, respectively, having each of the patterned and stacked layers 106, 108, 110, 114, 116, and 118 etched to expose the rowline 102. The etching process segments and isolates stacks of layers 106, 108, 110, 114, 116, and 118 to form segmented stacks having sidewalls 160. The cross-section of the segmented stacks is defined by the lateral dimensions of patterned disposable hard mask 118. In one embodiment, the cross-section of the segmented stacks is rectilinear in shape (e.g. square, rectangle, or other shape having at least one straight edge along its perimeter). In another embodiment, the cross-section of the segmented stacks is rounded in shape (e.g. circular, elliptical or other shape having at least a portion of its perimeter rounded). After the etch process is completed, the patterned photoresist layer 118 of the segmented stacks is stripped using conventional techniques to form pillar structure access device 123 shown in FIGS. 11B and 12B. The pillar structure access device may also be referred to herein as a pillar access device.

A potential adverse effect may arise if the etching process used to form the segmented stacks is permitted to expose rowline 102 as indicated in FIGS. 11A and 12A. Specifically, etching down to rowline 102 subjects rowline 102 to the etch treatment and may lead to the removal of metal atoms or fragments from rowline 102. The removed metal may contaminate one or more of layers 106, 108, 110, 114, and 116 and thereby compromise the performance of barrier layers and/or the electronic properties of the access device layers included in the segmented stacks. Etch residuals from rowline metals such as Cu, for example, are known to degrade the characteristics of diode access devices.

Figure 13A:
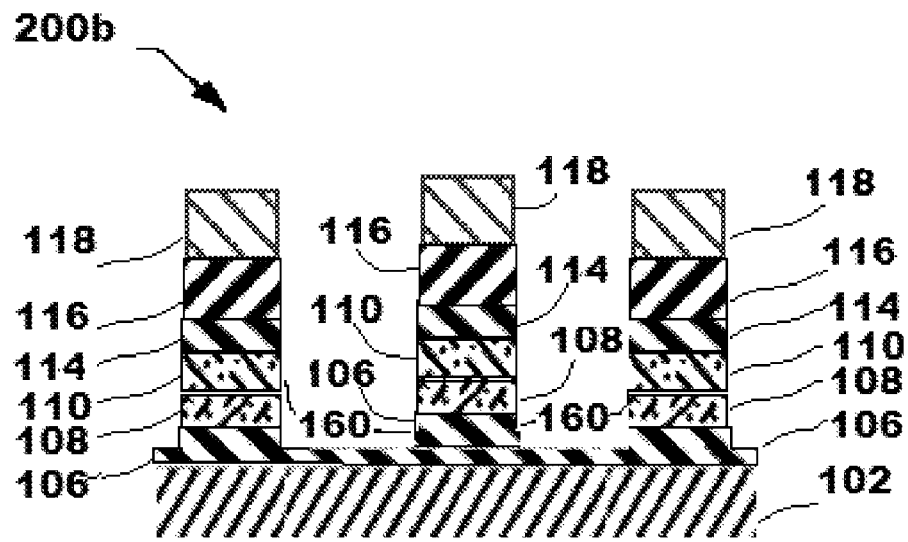
Figure 14A:
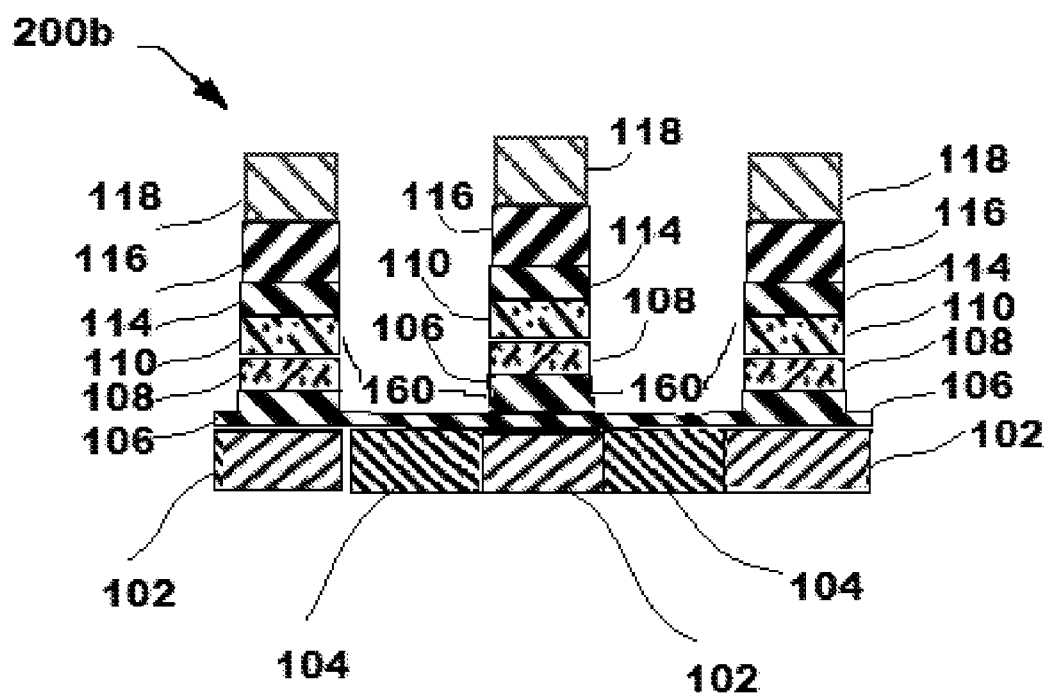
Figure 13B:
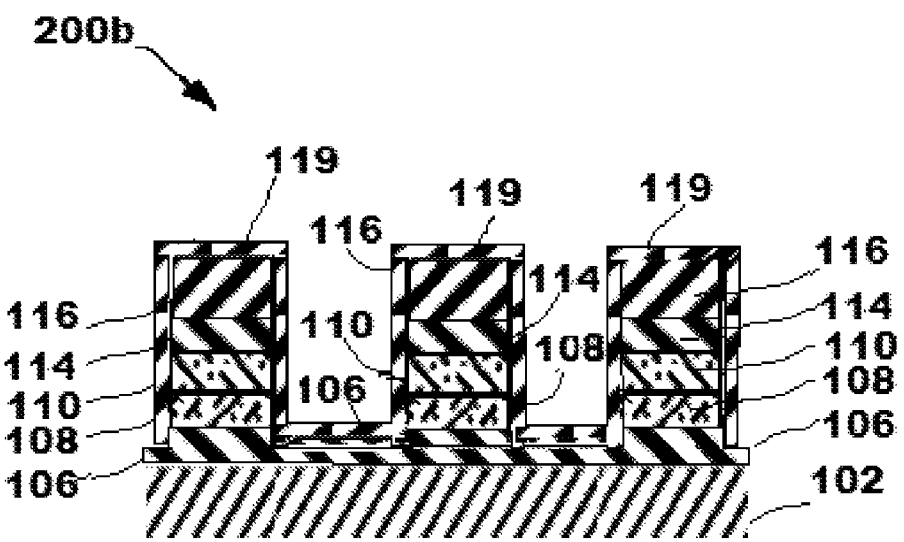
Figure 14B:
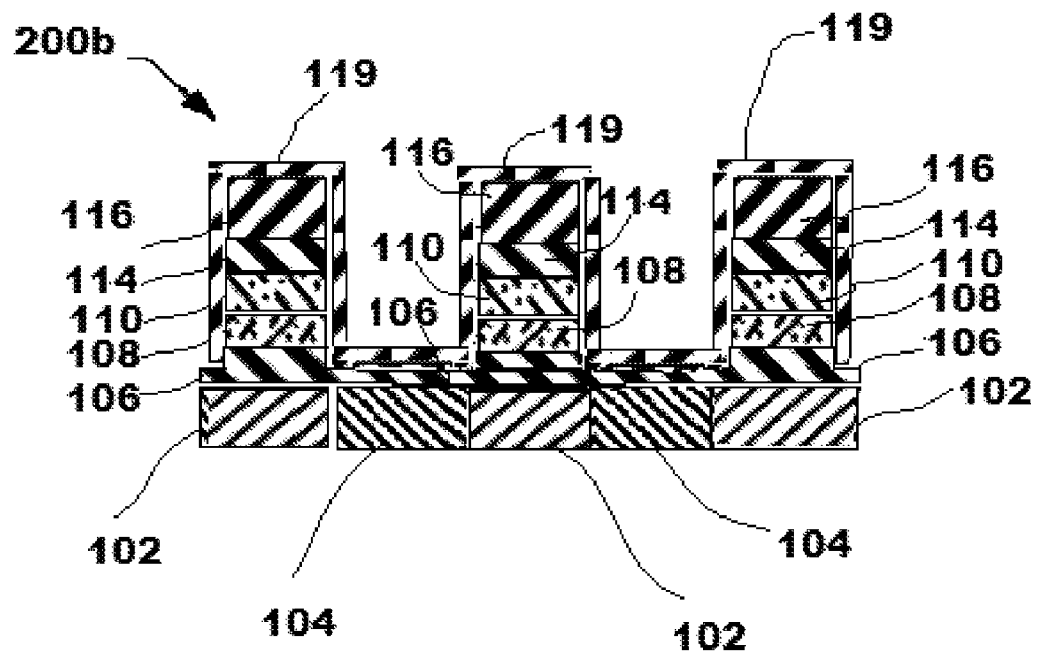

To prevent contamination or degradation of the access device or barrier layer characteristics, an alternative embodiment of the instant invention is contemplated. FIGS. 13A and 14A illustrate a memory cell 200b having the layers 106, 108, 114, 116 and 118 etched down to, but only partially through, first barrier layer 106. By terminating the etching process without subjecting rowline 102 to the etch treatment, exposure of sidewalls 160 of the segmented stacks to etched metal residuals is avoided. In this embodiment, patterned photoresist 118 is next removed and an additional protective layer 119 is formed over the segmented stacks before etching through to rowline 102. The protective layer 119 is shown in FIGS. 13B and 14B. The protective layer 119 is then anisotropically etched to remove the horizontal portions thereof and leave protective sidewall spacer 121 over pillar access device 123. Following the anisotropic etch of protective layer 119, etching of optional first barrier layer 106 is completed to expose rowline 102 and provide the structure shown in FIGS. 15 and 16. This embodiment is advantageous because the presence of sidewall spacer 121 protects pillar access device 123 from residual metal atoms or metal fragments that may be produced during the step of etching first barrier layer 106 to expose rowline 102.

Figure 15:
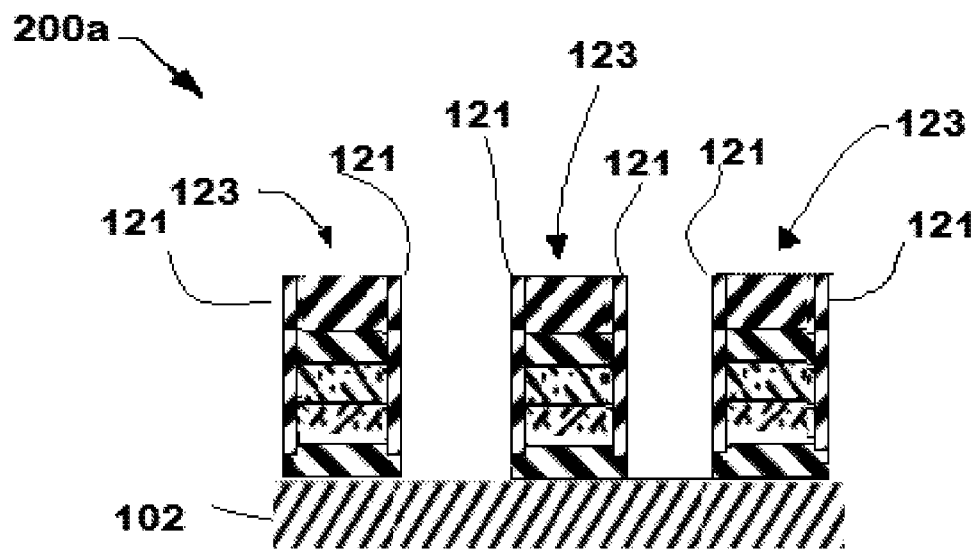
FIGS. 15 through 16 show a process for making an embodiment of the memory cell in accordance with an embodiment of the invention.
Figure 16:
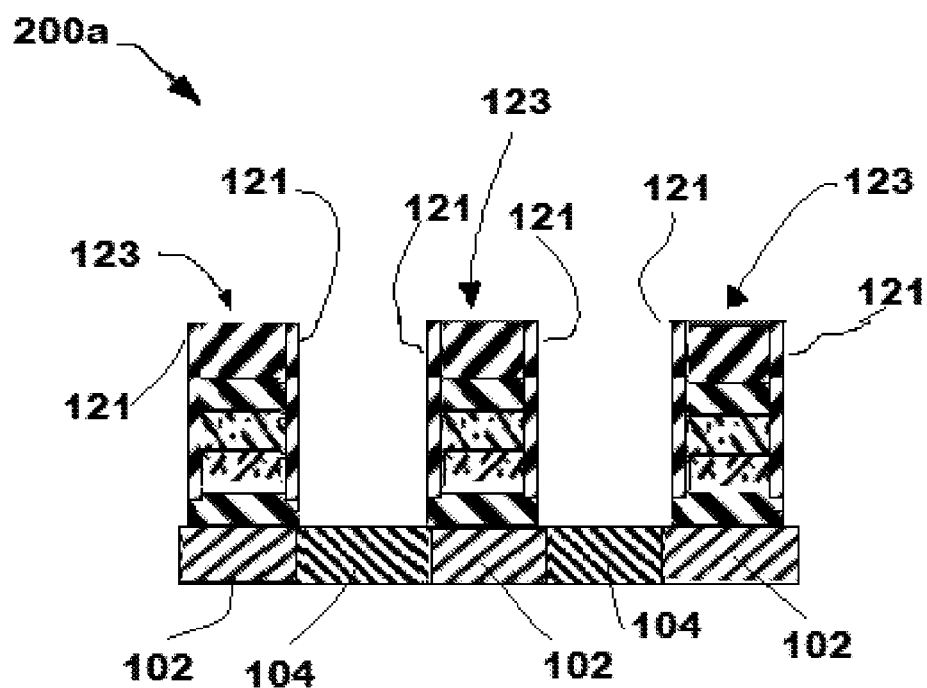

Sidewall spacer 121 shown in FIGS. 15-16 is preferably insulating material deposited on the outer sidewall 160 of the pillar structure 123 of the memory cell 200a. The spacer layer 121 may be formed in any suitable manner, such as by chemical vapor deposition (CVD). The dielectric spacer 121 is preferably chosen to have good thermal insulation properties to minimize the rate of heat loss from, and programming energy of, the subsequently deposited programmable resistance material (see below). The spacer 121 may also operate to decrease the rate at which thermal energy flows from the pillar structure 123 to the surrounding structure to facilitate more effective retention of heat within the subsequently deposited programmable resistance material.

In an embodiment of the invention, the sidewall spacer material 121 is formed from silicon nitride or silicon dioxide. The sidewall spacer may also be formed of other dielectric materials, including one or more materials selected from the group consisting of oxides, nitrides, oxynitrides, carbonitrides, fluorides, sulfides, chlorides, carbides, borides, phosphides, and mixtures or alloys thereof. Alternately, at least one thermal insulation layer may include an organic dielectric material. Further examples of thermal insulation layer materials include glasses, polymers, sol-gel materials, or other solution-deposited insulators. Silica is still another example of a thermally insulating material that may be used to form sidewall layer 121.

Additionally, the pillar structure 123 bounded by spacer 121 forms a self-aligned structure adapted to have a programmable resistance layer deposited thereon.

Further processing steps are now described and may be applied to either the structure shown in FIGS. 11B-12B or the structure shown in FIGS. 15-16. The following discussion is based on the structure shown in FIGS. 15-16. An analogous set of processing steps applies to the structure shown in FIGS. 11B-12B.

Figure 17:
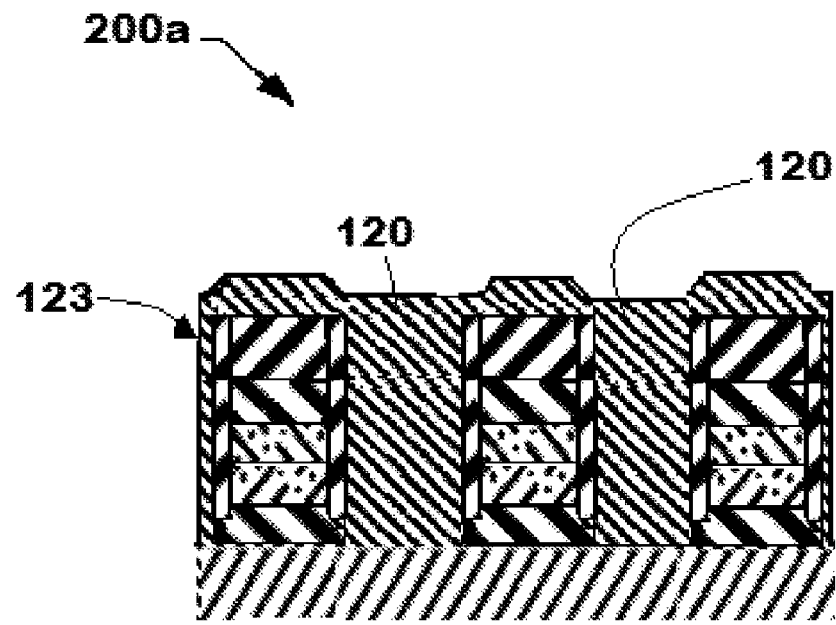
FIGS. 17 through 26 shows a process for making a memory cell shown in FIGS. 5-14 in accordance with an embodiment of the invention.
Figure 18:
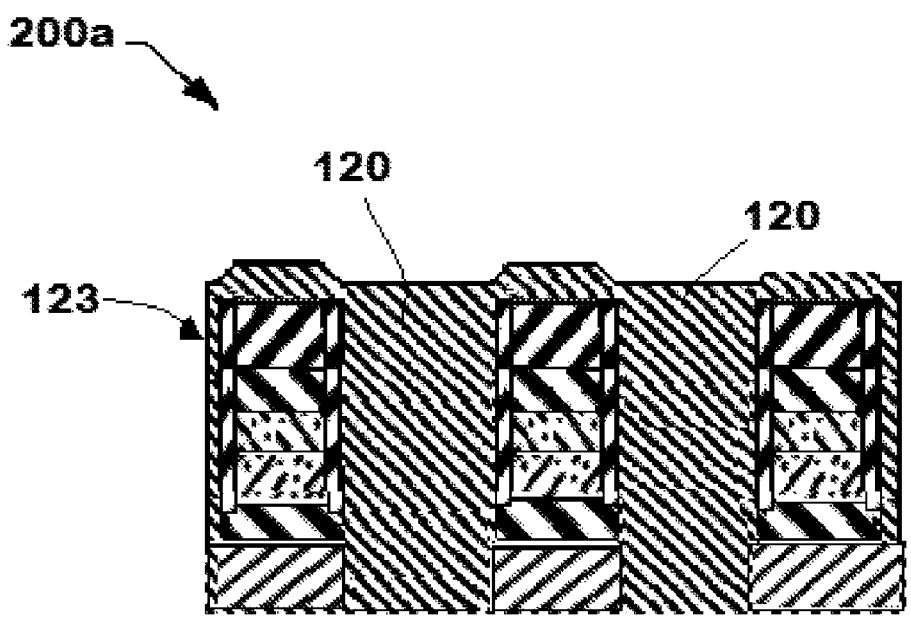

In an embodiment of the invention, shown in FIGS. 17-18, an insulating fill layer 120 is next deposited over the memory cell 200a of FIGS. 15-16, with an insulating fill material such as, but not limited to a high density plasma (HDP) oxide. The HDP deposition technique is particularly effective because it is more conducive to filling the spaces between the segmented pillar structures 123 than techniques such as sputtering. CVD and other conformal techniques provide a similar benefit and also facilitate dense filling of high aspect ratio features. Insulating fill layer 120 may also be a glass, polymer, or dielectric formed from a spin-on process.

Figure 19:
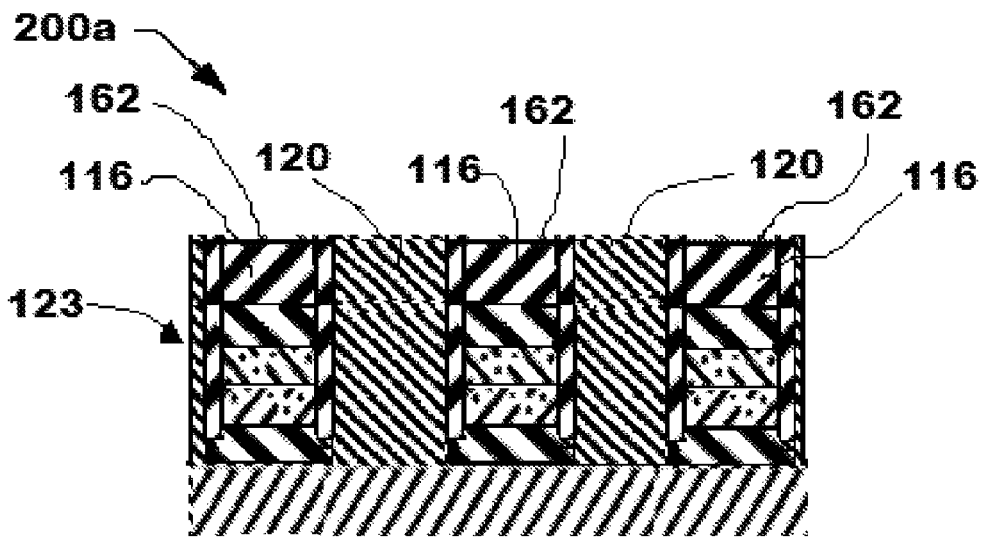
Figure 20:
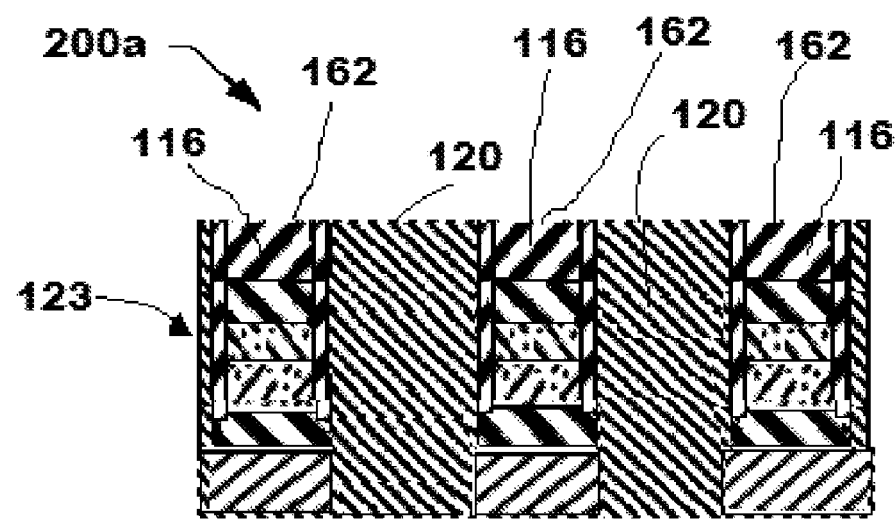

FIGS. 19-20 illustrate the memory cell 200a of FIGS. 17-18, respectively, with the insulating oxide 120 planarized by a planarizing process such as CMP, thereby exposing a top surface 162 of the disposable hard mask layer 116.

Figure 21:
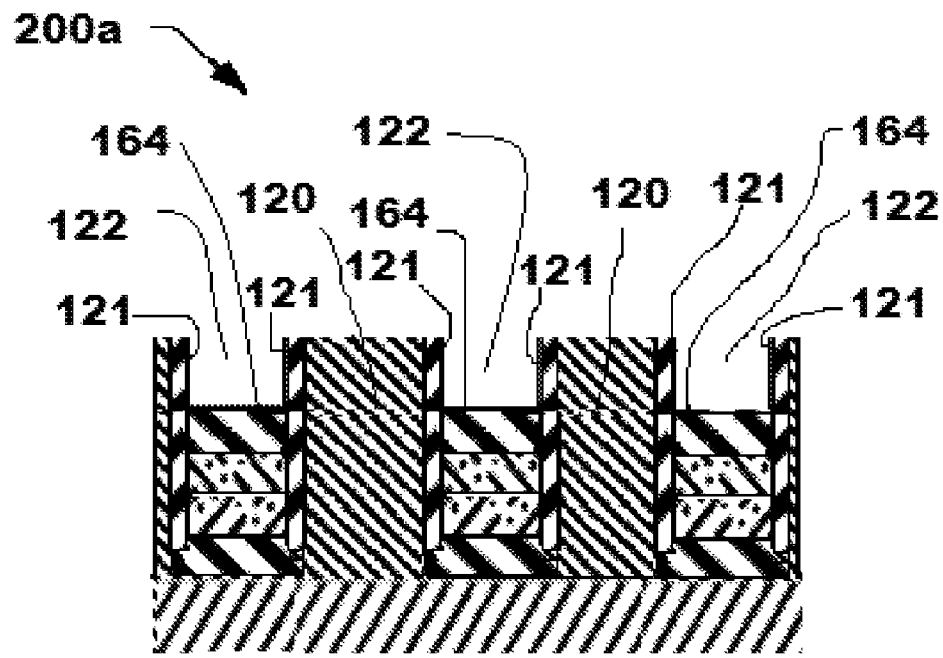
Figure 22:
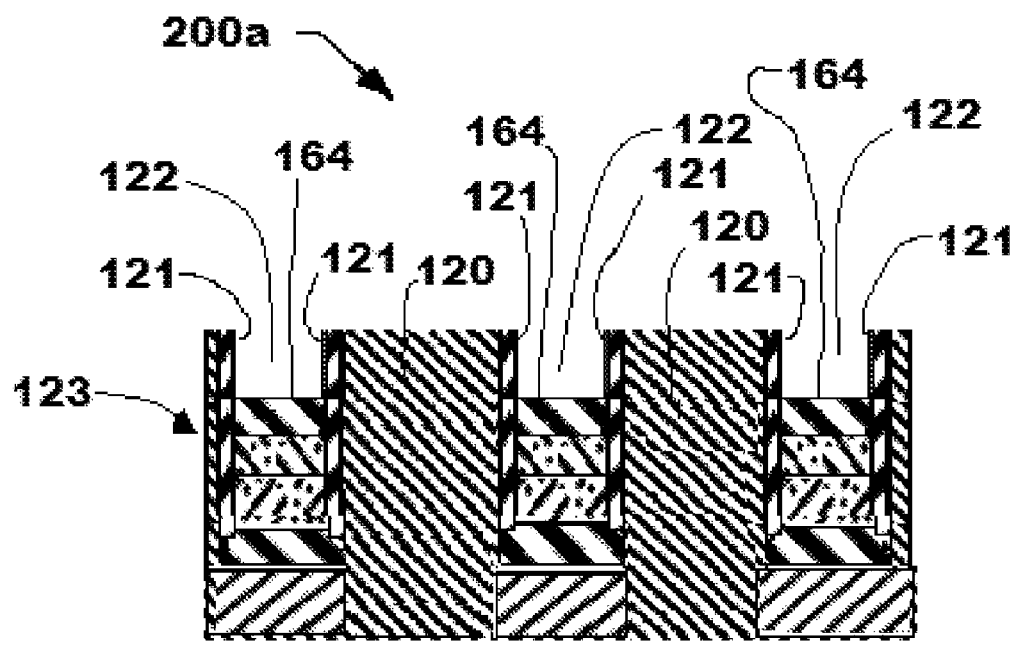

FIGS. 21-22 illustrate the memory cell 200a of FIGS. 19-20, respectively, following a further step in which the disposable hard mask 116 has been selectively etched back relative to the surrounding oxide 120 to form opening 122.

The disposable hard mask 116 is etched to the immediate underlying layer (either the second barrier layer 114, or the second layer of the diode select device 112 if the barrier layer 114 is not needed). The disposable hard mask selective etchant is independent of the rowline metal used. Selective etching may be used to remove the disposable hard mask with or without etching the HDP oxide or the immediate underlying layer. Thus, the hard mask layer 116 may be selectively etched with respect to the oxide fill 120 and/or with respect to the immediate underlying layer in pillar access device 123.

A selective etch of disposable hard mask layer 116 relative to sidewall layer 121 and oxide fill 120 using either a wet chemical etch or dry plasma etch. In an embodiment of the invention, the hard mask material is a polyimide or other polymeric material and selective etching is accomplished with an $O_2$ plasma etch. In another embodiment, the disposable hard mask 116 is formed from silicon nitride and selective etching is accomplished with a phosphoric acid based wet etch. In another embodiment, the silicon nitride may be preferentially etched relative to oxides with a $SF_6$ based plasma etch chemistry.

In an embodiment of the invention, the sidewall spacer 121 may be etched or remain intact depending on the composition of the spacer 121 relative to the surrounding oxide 120 and the disposable hard mask layer 116. The selective etch may be performed either with wet chemistry or plasma etching.

Referring to FIGS. 21-22, in an embodiment of the invention, an opening 122 is formed above an immediate underlying layer (wherein the immediate underlying layer is the second barrier layer 114 if the second barrier layer 114 is needed, or wherein the immediate underlying layer is the top layer 110 of access device 112 if the second barrier layer 114 is not needed) to expose a top surface 164 of the underlying layer. Generally, the opening 122 may be any shape that is bounded by the spacer 121 or oxide fill 120 or that is permitted by the cross-sectional shape of pillar structure access device 123. For example, the opening 122 may be formed as a substantially rectangular or circular hole or pore. Alternately, the opening 122 may be formed as a trench.

Figure 23:
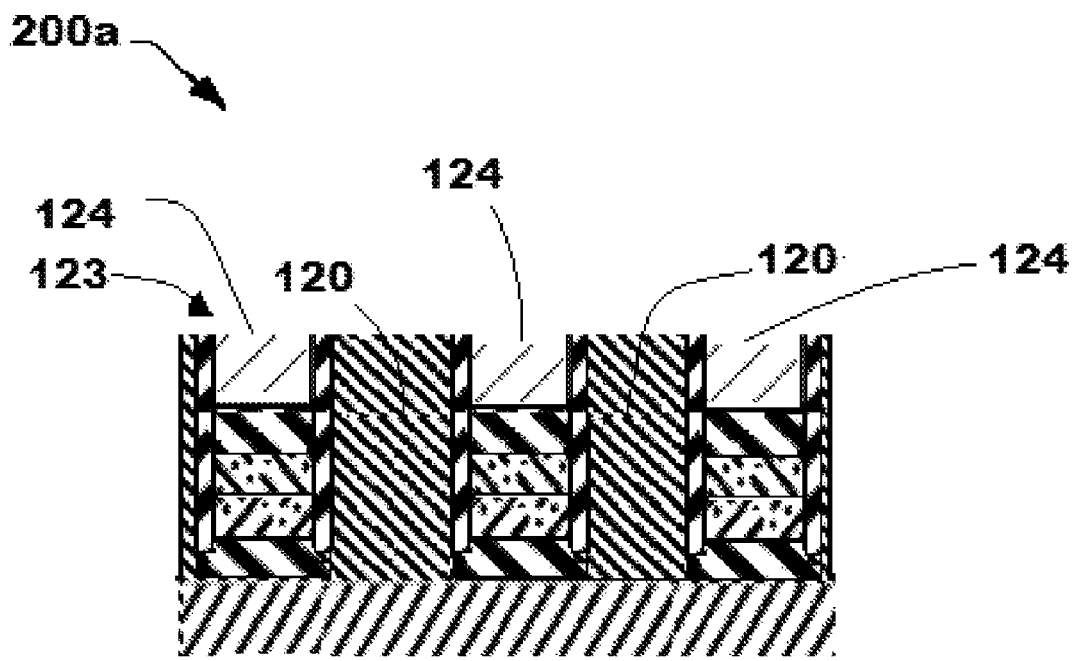

In an embodiment of the invention illustrated in FIGS. 23-24, a memory cell 200a is shown including a programmable resistance material (PRM) layer 124 conformally or non-conformally deposited in opening 122 on the top surface 164 of the exposed underlying layer (either on layer 114 or 110 depending on the access device 112 materials used to form access device 112).

In the embodiment shown, the PRM material 124 fills the opening 122. However, it is also possible that the PRM material 124 does not completely fill the opening 122. The PRM layer 124 may be deposited using a deposition process such as physical vapor deposition, chemical vapor deposition, metal organic chemical vapor deposition (MOCVD), atomic layer deposition (ALD), sputtering or evaporation. After deposition, PRM layer 124 may be planarized through a process such as chemical mechanical polishing (CMP), mechanical polishing or etching (wet or dry). FIGS. 23-24 illustrate the memory cell 200a shown in FIGS. 21-22 further including a PRM layer 124 deposited and planarized over the immediate underlying layer and flush with oxide fill 120 and sidewall layer 121.

The memory element of the memory cell 200a generally comprises a volume of memory material within opening 122. Any memory or electronic material may be used in connection with the access device. In an embodiment of the invention, the volume of memory material is a programmable resistance memory material which is programmable to at least a first resistance state and a second resistance state. The memory material is preferably programmed in response to electrical signals. Preferably, the electrical signals used to program the materials are electrical currents which are directed to the memory material and regulated by pillar access device 123.

The programmable resistance material layer 124 may be any variable voltage or variable resistance material having characteristics that vary when an electrical pulse is applied, such as a phase change material or a resistive oxide. A programmable resistance memory material may be any material that undergoes a chemical or physical transformation in response to an electrical signal, where the transformation is manifested as a variation in electrical resistivity.

The memory material may be a phase change material having one or more structural states having distinguishable electrical resistivity. The structural states may include crystalline states, amorphous states, and states having variable proportions of crystalline and amorphous phase portions. Changes in electrical resistivity may be accomplished through transformations between or among two or more crystalline, amorphous, or partially crystalline and partially amorphous states. Materials that transform between different crystalline states (e.g. states that differ in crystallographic unit cell parameters) are also within the scope of the instant invention. The phase-change materials may be any phase change memory material known in the art. In an embodiment of the invention, the phase change materials are capable of exhibiting a first order phase transition. Examples of materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein.

The phase change materials may be formed from a plurality of atomic elements. Preferably, the memory material includes at least one chalcogen element. The chalcogen element may be chosen from the group consisting of Te, Se, and mixtures or alloys thereof. The memory material may further include at least one element selected from the group consisting of Ge, Sb, Bi, Pb, Sn, As, S, Si, P, O, and mixtures or alloys thereof. These alloys will be selected so as to create a material capable of assuming multiple, generally stable, states in response to the stimulus applied.

In one embodiment of the invention, the memory material comprises the elements Te, Ge and Sb. In another embodiment, the memory material consists essentially of Te, Ge and Sb. An example of a memory material which may be used is $Ge_2Sb_2Te_5$ (GST).

The memory material may include at least one transition metal element. Preferably, the one or more transition metal elements are selected from the group consisting of Cr, Fe, Ni, Nb, Pd, Pt and mixtures or alloys thereof. The memory materials which include transition metals may be elementally modified forms of the memory materials in the Te—Ge—Sb ternary system. This elemental modification may be achieved by the incorporation of transition metals into the basic Te—Ge—Sb ternary system, with or without an additional chalcogen element, such as Se.

In an embodiment of the invention illustrated in FIGS. 25-26, the memory cell 200a illustrated in FIGS. 23-24, includes a top column layer 140 formed over each PRM layer 124. The top column layer may be formed by a metallization process such as, but not limited to, subtractive metallization or a damascene process. Top column layer 140 is a conductive layer deposited over the memory material 124 to form an upper electrode for the memory cell 200a.

In an embodiment of the invention, a similar metallization process may be used to form a top metallized column on the memory cells 200c, 200d, and 200e shown in FIGS. 31-32, 35-36, or FIGS. 39-40, respectively.

Figure 27:
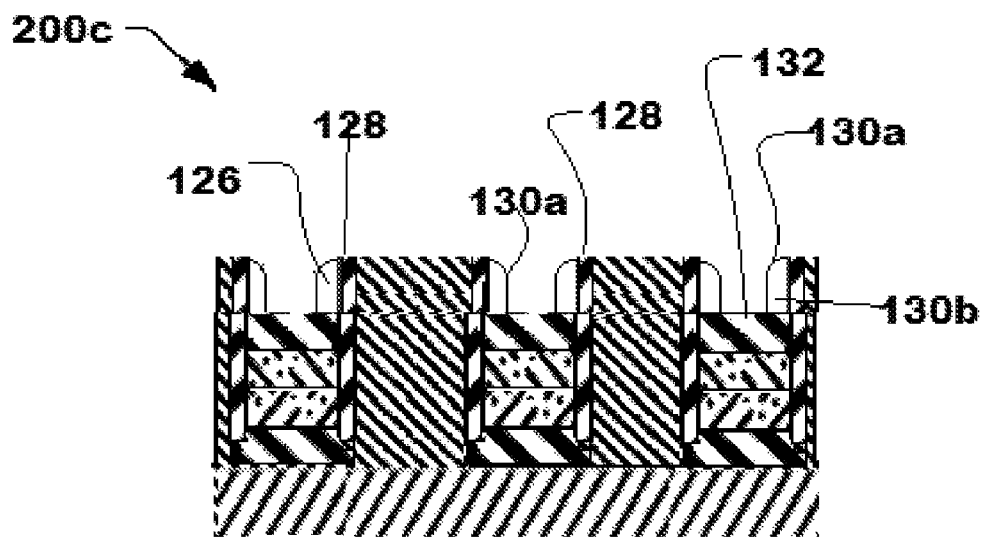
Figure 28:
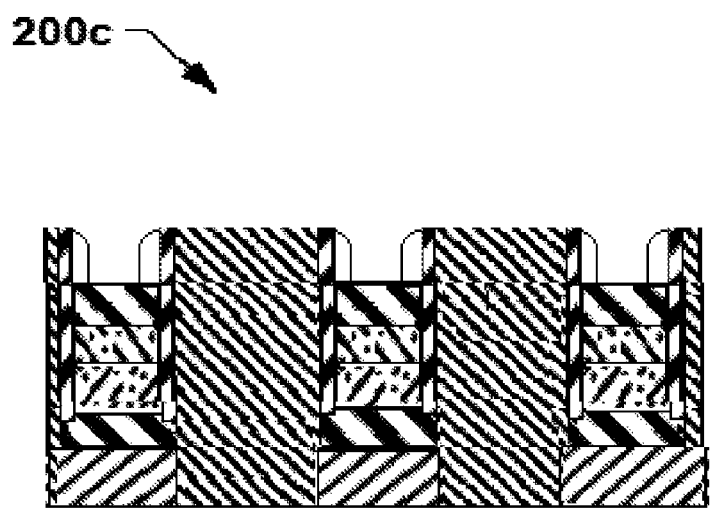

In an embodiment of the invention illustrated in FIGS. 27-28, a memory cell 200c is formed by depositing an insulating spacer layer within the opening 122 shown in FIGS. 21-22 on the immediate underlying layer before forming the memory or electronic material. The processing steps associated with forming the insulating spacer layer in opening 122 are analogous to those described hereinabove for forming sidewall layer 121. Generally, an insulating layer is first deposited over the structure shown in FIGS. 21-22 and then anisotropically etched to form insulating spacers 126. The spacers 126 have a flared or arcuate tapered portion 130a. The insulating spacer 126 may be formed from an insulating material such as $SiO_2$ or $Si_3N_4$ and operates to reduce the contact area between a subsequently deposited programmable resistance material with the bottom electrode formed by the rowline 102. The reduction in contact area is beneficial because it reduces the volume of the PRM that must be programmed to produce a change in resistance and as a result, the energy required for programming is decreased. The remaining spacer portion 126 is a dielectric sidewall spacer disposed along the inner sidewall surface of the opening 122 and operates to narrow the width dimensions of the opening 122.

As shown in FIGS. 27-28, the spacer layer is anisotropically etched by etching the horizontal portions thereof, according to the well known spacer formation technique to form a spacer 126 which extends along the vertical sides of the opening 122 (along an inner periphery of the opening 122). The base of the spacer 126 forms a rectilinear or round and spacer 126 has a top formed by an arcuate portion 130a of the strip.

Figure 29:
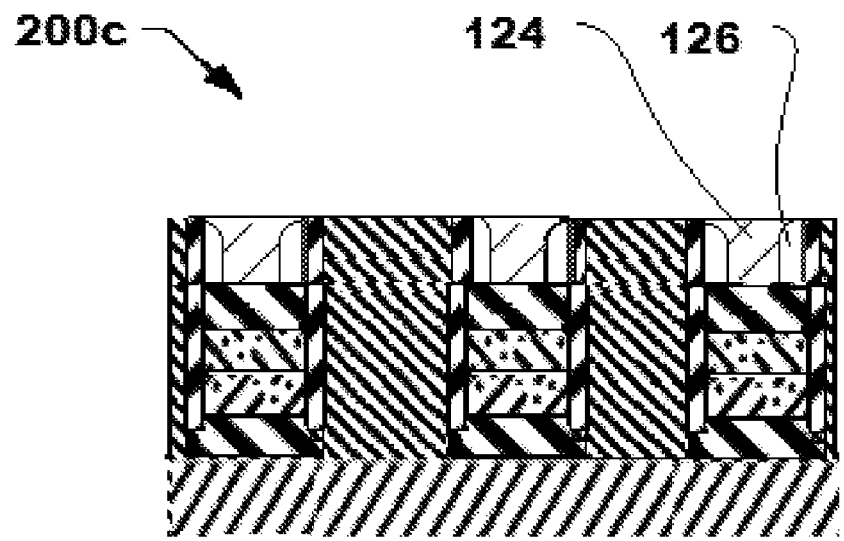
Figure 30:
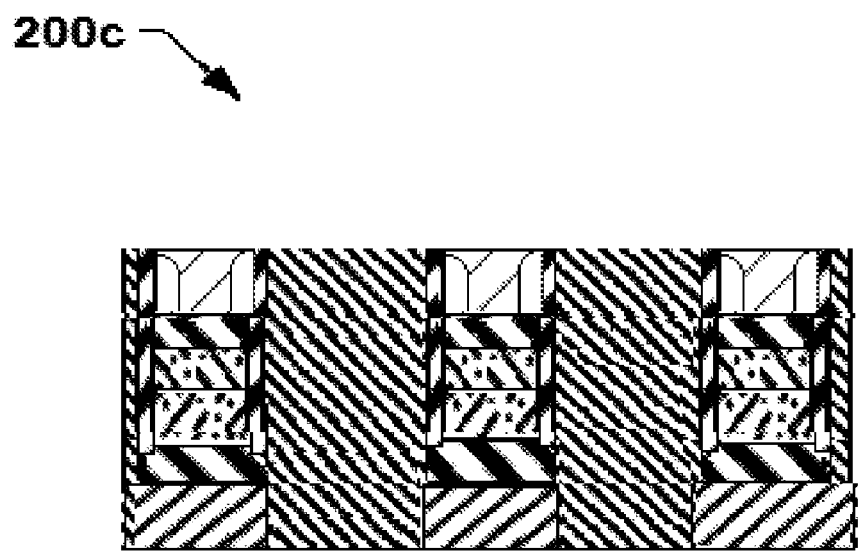

Next, as shown in FIGS. 29-30, the programmable resistance material 124 is deposited on the immediate underlying layer in a similar manner as described with reference to FIGS. 23-24. The programmable resistance material 124 is in direct contact with the underlying layer and fills or occupies the opening 122. The arcuate and rectangular wall formed by the spacer 126 promotes filling of the opening 122 and may alleviate problems associated with filling opening 122 (which may be a high aspect ratio feature).

In an embodiment of the invention shown in FIGS. 29-30, a portion of the programmable resistance material 124, exceeding the opening 122 is removed by a planarizing process such as, but not limited to CMP. The CMP process may be terminated on reaching an upper surface of the sidewall spacer 121. The CMP process may alternatively be continued to remove arcuate portion 130a of spacer 126. A portion of the PRM, which is housed in the opening 122, is left, as shown in FIGS. 29-30. Moreover, the portion is self-aligned to the immediate underlying layer (114 or 110). As an alternative, the portion may be removed by an etch-back technique using the immediate underlying layer as a stop layer.

Figure 31:
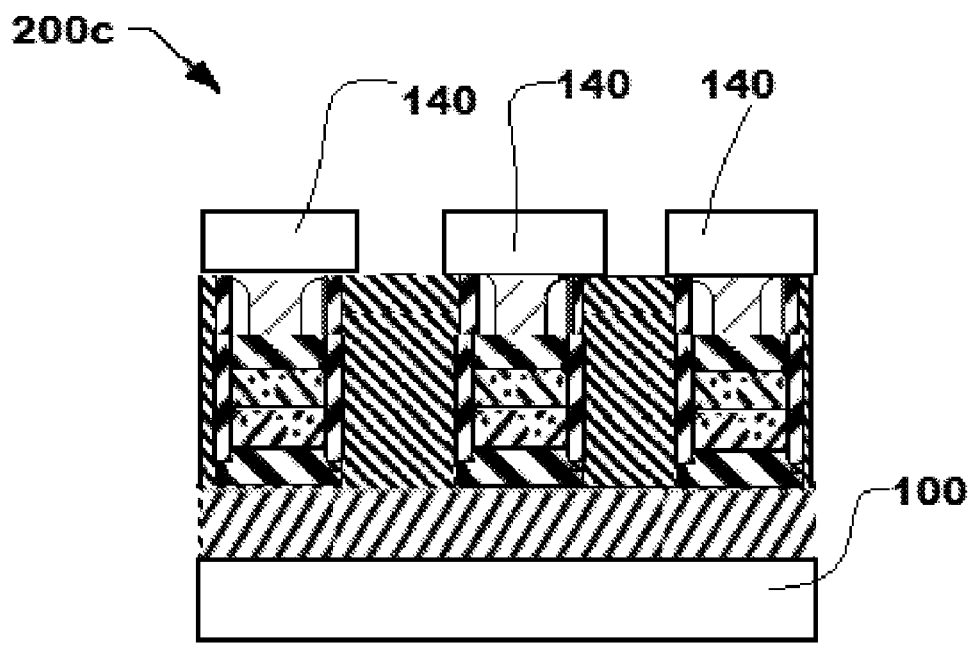
Figure 32:
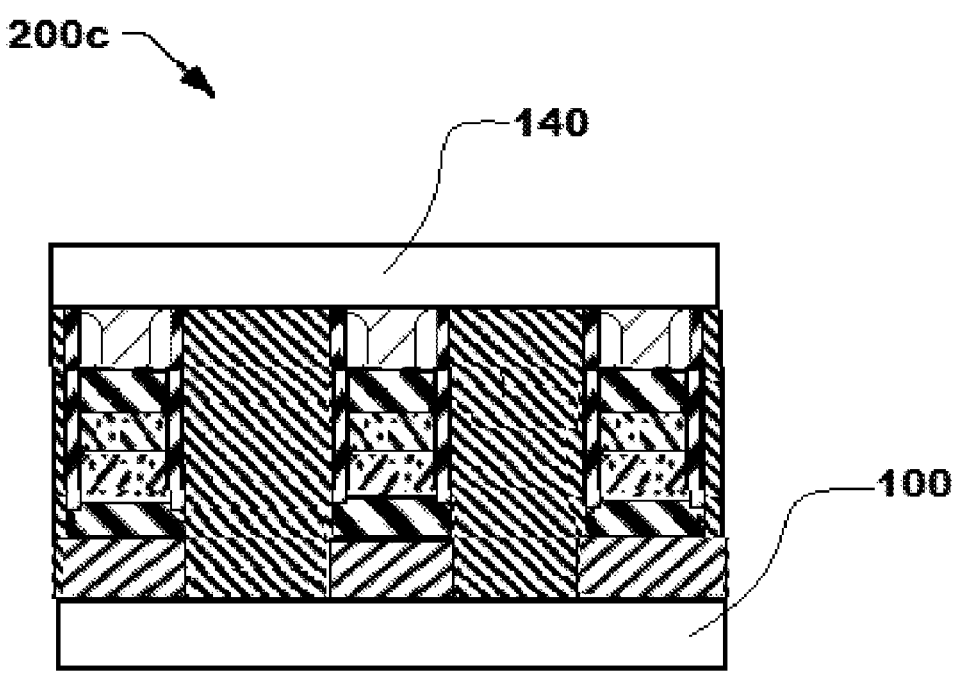

In an embodiment of the invention, FIGS. 31-32 illustrate the memory cell 200c having a top electrode 140 formed by a metallization process similar to the process disclosed with reference to FIGS. 25-26.

Figure 33:
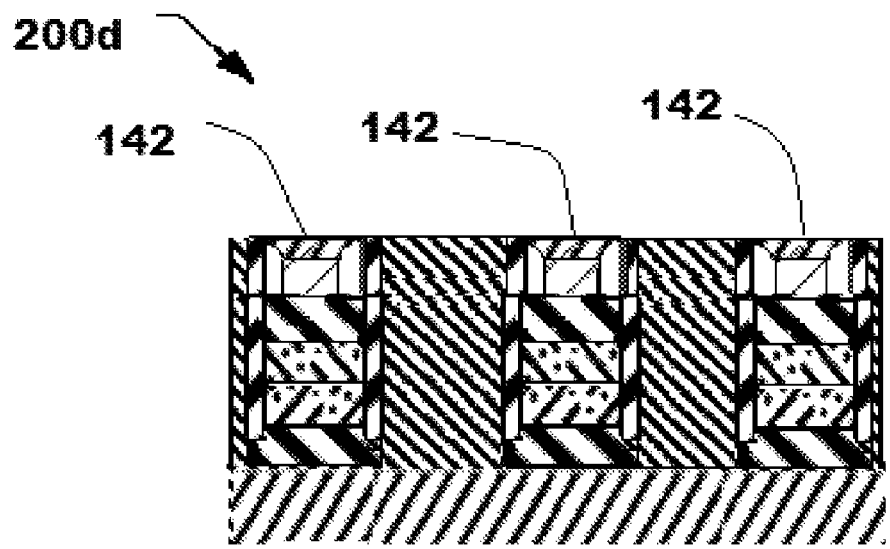
FIGS. 33 through 36 shows a process for making a memory cell in accordance with an embodiment of the invention.
Figure 34:
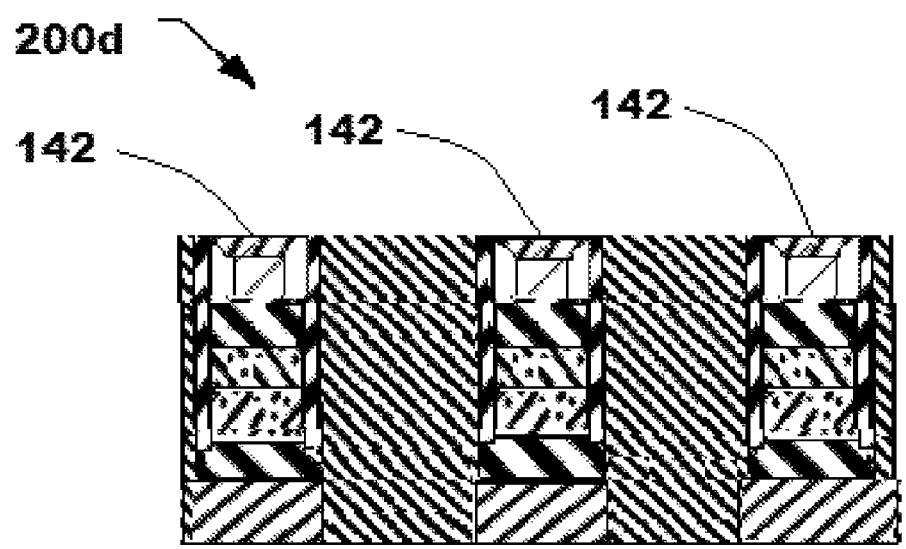

In an embodiment of the invention, FIGS. 33-34 illustrate a memory cell 200d including a recessed PRM layer 124 conformally deposited on the immediate underlying layer of the memory cell 200c shown in FIGS. 27-38. Referring to FIGS. 33-34, the PRM layer 124 is then recessed below the top surface of the spacer 121 to leave free an upper cavity portion of the opening 122. This can be accomplished by over-etching during the excess-material removal dry chemical etch, or by another, subsequent etch process. The upper cavity portion 122a sidewall surface 122S as well as a bottom surface 122B (which corresponds to the top surface of the immediate underlying layer).

Figure 35:
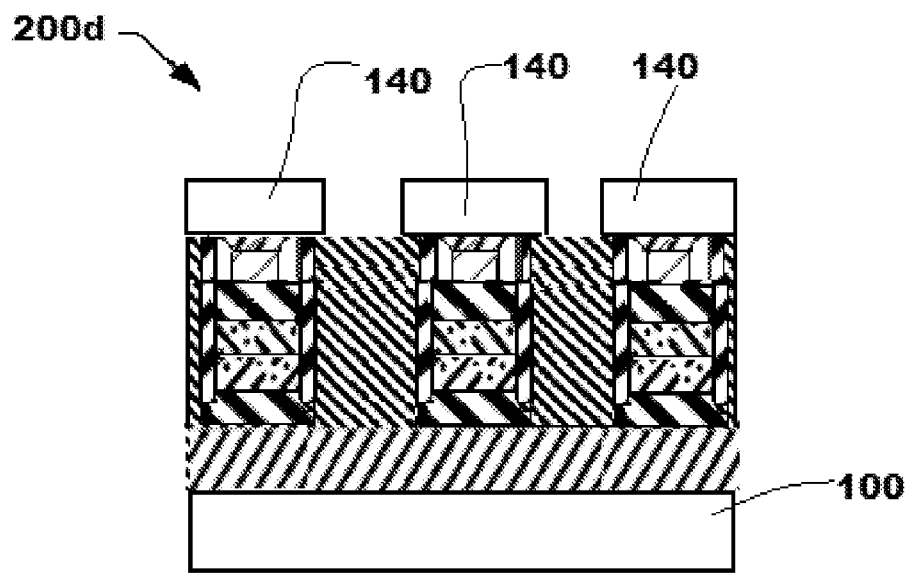
Figure 36:
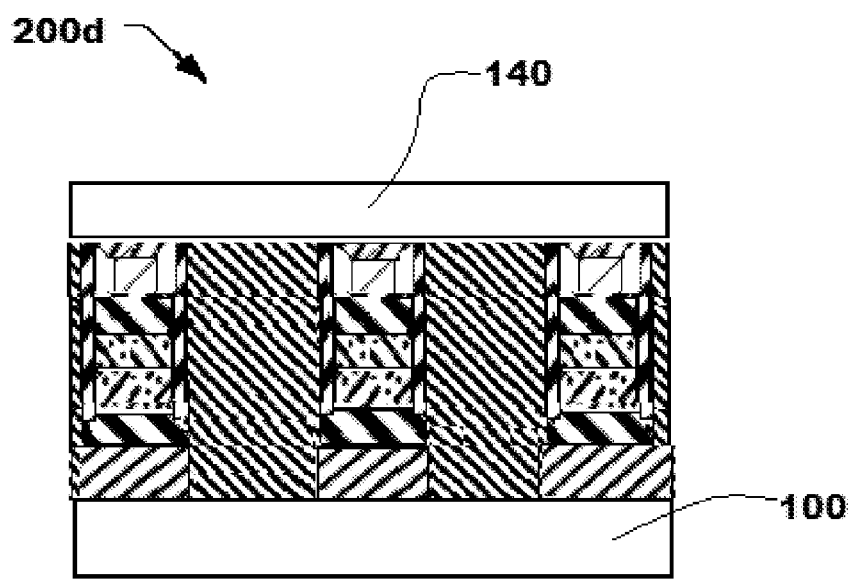

As shown in FIGS. 33-34, a layer of conductive material is deposited into the upper cavity portion of the opening 122 to form an upper contact layer 142. Once the upper contact layer 142 is formed, a planarizing process such as CMP may be performed to planarize an upper surface of the contact layer 142 so that the upper surface of the contact layer 142 is flush with an upper layer of the oxide fill 120. FIGS. 35-36 illustrate device 200d having a top electrode 140 formed thereon formed by a metallization process similar to the metallization process disclosed with reference to FIGS. 31-32.

Figure 37:
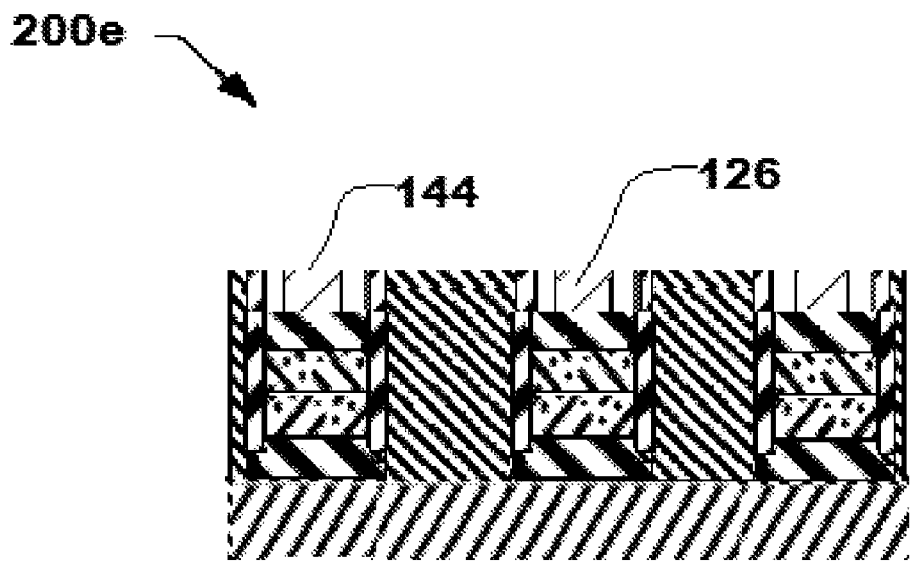
FIGS. 37 through 40 shows a process for making a memory cell in accordance with an embodiment of the invention.
Figure 38:
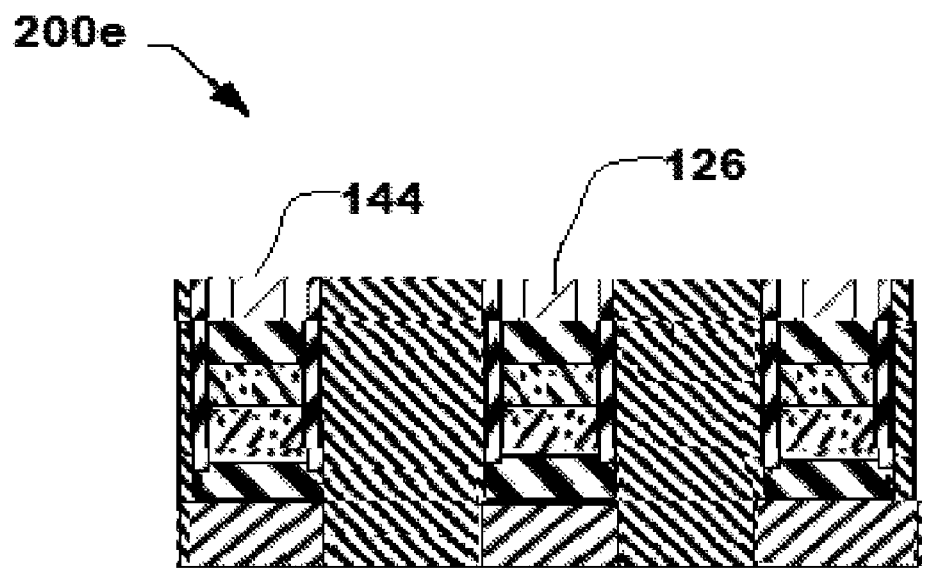
Figure 39:
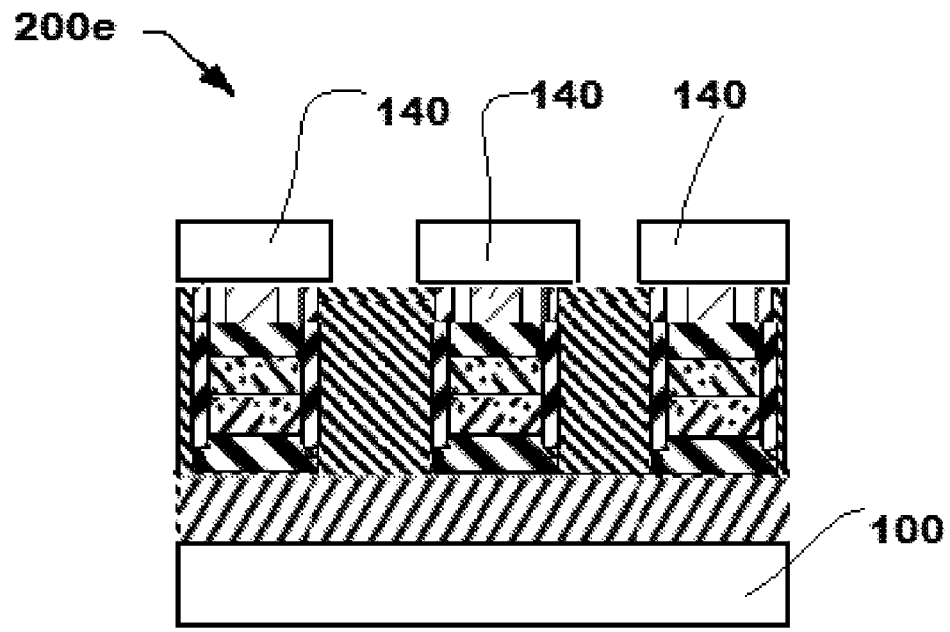
Figure 40:
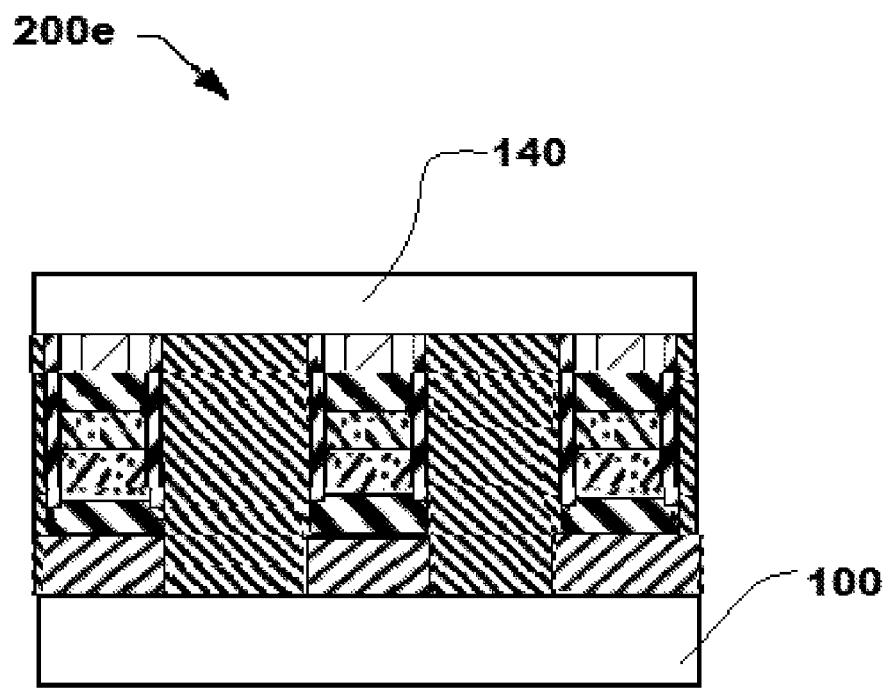

In an embodiment of the invention illustrated in FIGS. 37-38, the device 200c illustrated in FIGS. 29-30 may be further planarized to eliminate the spacer flare 130a, to define a planarized top surface 170 of the spacer 126, thereby forming device 200e. FIGS. 39-40 illustrate device 200e having a top electrode 140 formed thereon formed by a metallization process similar to the process disclosed with reference to FIGS. 25-26.

The instant pillar structure access device is generally formed on a conductive layer that provides current to the access device and an electronic material in electrical communication with the access device. In one embodiment, the pillar access device contacts an insulating layer. In another embodiment, the pillar access device is circumscribed by an insulating layer. In yet another embodiment, the pillar access device is partially embedded in an insulating layer. In a further embodiment, the pillar access device is fully embedded in an insulating layer. In still other embodiments, the insulating layer is contacted or circumscribed by a second insulating layer.

The pillar access device generally has a columnar or post structure and includes a top surface remote from a substrate or lower conductive layer and a lateral sidewall surface. The lateral cross-section of the pillar access device may be rectilinear or rounded. The top surface of the pillar access device may be above, flush with, or recessed below the top surface of a surrounding insulating layer. The top surface of the electronic material may also be above, flush with, or recessed below the top surface of a surrounding insulating layer. The top surface of the electronic material may be in contact with an upper conductive layer, where the upper conductive layer may be above, flush with, or recessed below the top surface of a surrounding insulating layer. Another insulating layer may be disposed between the electronic material and the surrounding insulating material.

The instant invention further includes an array of electronic devices, where each electronic device has a pillar structure access device as described hereinabove and each electronic device is spatially separated from the others. In one embodiment, the spaces between the electronic devices are occupied by an insulating material.

It is to be understood that the disclosure set forth herein is provided in the form of detailed embodiments described for the purpose of making a full and complete disclosure of the invention, and that such details are not to be interpreted as limiting the true scope of this invention as set forth and defined in the appended claims.

I claim:

1. An electronic device comprising:
   a substrate;
   a first conductive region formed on said substrate;
   an access device in electrical communication with said first conductive region, said access device having a pillar structure, said pillar structure having an exterior surface, said exterior surface including a sidewall surface and a top surface;
   a first dielectric material in direct contact with said sidewall surface, said first dielectric material not contacting said first conductive region or said substrate; and
   an electronic material in electrical communication with said access device.

2. The electronic device of claim 1, wherein said access device is selected from the group consisting of a diode, a transistor, and a threshold switch.

3. The electronic device of claim 1, wherein said pillar structure has a rectilinear cross-section.

4. The electronic device of claim 1, wherein said pillar structure has a rounded cross-section.

5. The electronic device of claim 1, wherein said access device directly contacts said first conductive region.

6. The electronic device of claim 5, wherein said electronic material directly contacts said access device.

7. The electronic device of claim 1, further comprising a barrier layer disposed between said first conductive region and said electronic material.

8. The electronic device of claim 1, wherein said pillar structure comprises a plurality of layers.

9. The electronic device of claim 8, wherein said first dielectric material is in direct contact with each layer of said plurality of layers.

10. The electronic device of claim 8, wherein said plurality of layers includes a first layer in direct contact with said first conductive region and said first dielectric material is in direct contact with said first layer.

11. The electronic device of claim 10, wherein said first layer is a barrier layer.

12. The electronic device of claim 10, wherein said first layer comprises a semiconducting material.

13. The electronic device of claim 1, wherein said first dielectric material circumscribes said access device.

14. The electronic device of claim 1, wherein said sidewall surface of said access device is embedded in said first dielectric material.

15. The electronic device of claim 14, wherein said top surface of said access device is recessed below the top surface of said first dielectric material.

16. The electronic device of claim 15, wherein the top surface of said electronic material is recessed below the top surface of said first dielectric material.

17. The electronic device of claim 16, further comprising a second conductive region, said second conductive region contacting said top surface of said electronic material.

18. The electronic device of claim 14, wherein said electronic material contacts said top surface of said access device.

19. The electronic device of claim 18, further comprising a second dielectric material, said second dielectric material contacting said electronic material and said first dielectric material.

20. The electronic device of claim 1, further comprising a second dielectric material in direct contact with said first dielectric material.

21. The electronic device of claim 20, wherein said second dielectric material circumscribes said first dielectric material.

22. The electronic device of claim 20, wherein said second dielectric material directly contacts said first conductive region or said substrate.

23. The electronic device of claim 1, wherein said electronic material is in electrical communication with said access device through said top surface.

24. The electronic device of claim 1, wherein said electronic material comprises a programmable resistance material.

25. The electronic device of claim 1, wherein said electronic material comprises a phase-change material.

26. The electronic device of claim 1, wherein said electronic material comprises a chalcogenide material.

27. An array of electronic devices comprising:
   a spatially-separated plurality of the electronic devices of claim 1.

28. The array of claim 27, further comprising a second dielectric material disposed between said electronic devices.

* * * * *